United States Patent
Yamazaki

(10) Patent No.: US 8,304,832 B2
(45) Date of Patent: Nov. 6, 2012

(54) SEMICONDUCTOR DEVICE AND MANUFACTURING METHOD THEREOF

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 373 days.

(21) Appl. No.: 12/325,729

(22) Filed: Dec. 1, 2008

(65) Prior Publication Data

US 2009/0140337 A1 Jun. 4, 2009

(30) Foreign Application Priority Data

Dec. 3, 2007 (JP) ................................. 2007-312762

(51) Int. Cl.
*H01L 29/786* (2006.01)
(52) U.S. Cl. ......... 257/347; 438/197; 438/455; 136/261
(58) Field of Classification Search .................... 438/79, 438/107, 128, 455, 458
See application file for complete search history.

(56) References Cited

U.S. PATENT DOCUMENTS

| | | | |
|---|---|---|---|
| 6,589,857 B2 * | 7/2003 | Ueda et al. .................... | 438/502 |
| 6,677,193 B2 | 1/2004 | Oashi | |
| 2003/0064553 A1 * | 4/2003 | Oashi .......................... | 438/197 |
| 2004/0180512 A1 * | 9/2004 | Linn et al. .................... | 438/458 |
| 2006/0138629 A1 * | 6/2006 | Fukazawa ..................... | 257/686 |
| 2008/0099066 A1 * | 5/2008 | Ito et al. ........................ | 136/261 |

FOREIGN PATENT DOCUMENTS

| | | |
|---|---|---|
| JP | 11-163363 | 6/1999 |
| JP | 2002-057309 | 2/2002 |
| JP | 2003-110108 | 4/2003 |

* cited by examiner

*Primary Examiner* — Marcos D. Pizarro
*Assistant Examiner* — Suian Tang
(74) *Attorney, Agent, or Firm* — Fish & Richardson P.C.

(57) ABSTRACT

A semiconductor device with increased freedom of wirings and a manufacturing method thereof are provided by enabling favorable connection between an upper wiring layer and a lower wiring layer through a semiconductor element. The semiconductor device includes: a first insulating layer over an insulating substrate; a first wiring layer and a second insulating layer on the first insulating layer; a single crystal semiconductor layer including a channel region and an impurity region, on the first wiring layer and the second insulating layer; a gate electrode over the channel region with a gate insulating layer interposed therebetween; a third insulating layer covering the first wiring layer, the single crystal semiconductor layer, and the gate electrode; and a second wiring layer over the third insulating layer. The first wiring layer is in contact with the impurity region, and the first and wiring layers are electrically connected to each other.

12 Claims, 12 Drawing Sheets

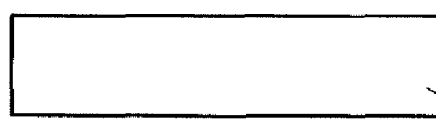
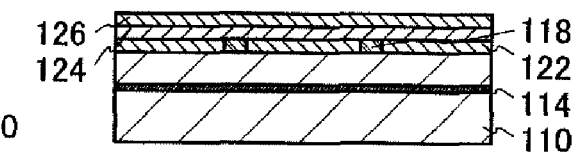
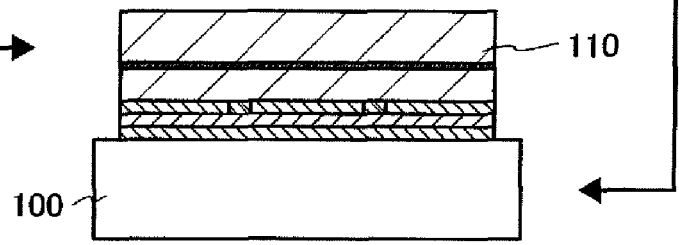
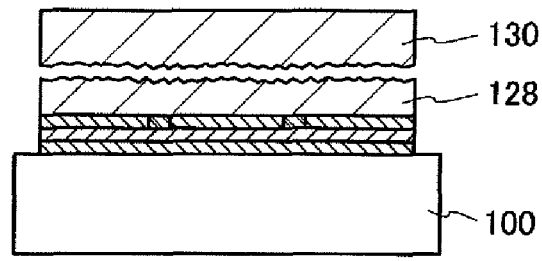
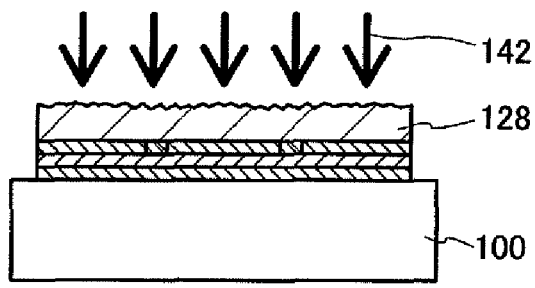
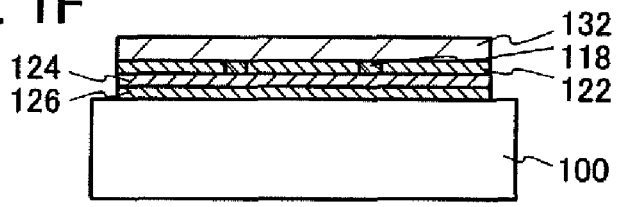

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

2. Description of the Related Art

In recent years, integrated circuits using an SOI (silicon on insulator) substrate instead of a bulk silicon wafer have been developed. By utilizing characteristics of a thin single crystal silicon layer formed over an insulating layer, transistors formed in the integrated circuit can be electrically separated from each other completely. Further, each transistor can be formed as a fully-depleted transistor, and thus a semiconductor integrated circuit with high added value such as high integration, high speed driving, and low power consumption can be realized. In the development of LSI using such an SOI substrate, improvement in operation frequency and processing capability is realized by reducing the area of a chip by using a multilayer wiring technique.

In recent years, a method for forming a single crystal silicon layer over a supporting substrate made of glass by using Smart Cut (registered trademark) has been proposed (e.g., see Reference 1: Japanese Published Patent Application No. H11-163363). Because a glass substrate has a larger area and is less expensive than a silicon wafer, when a glass substrate is used as a base substrate, an inexpensive large-area SOI substrate can be manufactured.

However, in the case where, after forming a transistor using a single crystal silicon layer over an insulating substrate such as glass, a wiring layer is provided over the transistor with an interlayer insulating layer interposed therebetween, miniaturization of the wiring layer is difficult because the planarity of the interlayer insulating layer is insufficient due to distortion of the substrate or the like.

In order to solve such difficulty of wiring miniaturization, a technique of manufacturing a miniaturized multilayer wiring below an SOI transistor by manufacturing the multilayer wiring prior to formation of the SOI transistor has been proposed (e.g., Reference 2: Japanese Published Patent Application No. 2003-110108).

SUMMARY OF THE INVENTION

It is effective to separately form a lower wiring layer and an upper wiring layer of a transistor according to need as described above by forming a minute wiring layer (lower wiring layer) over a planar substrate in advance. However, in the case where the upper wiring layer and the lower wiring layer of the transistor are independently formed, the freedom of the wirings is limited. In addition, even if a miniaturized wiring layer is provided below a transistor by forming a minute wiring (lower wiring layer) over a planar substrate in advance, the miniaturization of an element is still limited.

In view of the aforementioned problems, it is an object of the present invention to provide a semiconductor device with increased freedom of wirings by enabling favorable connection between an upper wiring layer and a lower wiring layer through a semiconductor element such as a transistor, and a manufacturing method thereof. Further, it is an object of the present invention to provide a miniaturized semiconductor device and a manufacturing method thereof.

According to one feature of a semiconductor device of the present invention, the semiconductor device includes: a first insulating layer over an insulating substrate; a first wiring layer selectively formed on the first insulating layer; a second insulating layer formed in a region other than a region in which the first wiring layer is formed, on the first insulating layer; a single crystal semiconductor layer including a channel region and an impurity region, on the first wiring layer and the second insulating layer; a gate electrode over the channel region of the single crystal semiconductor layer with a gate insulating layer interposed therebetween; a third insulating layer covering the first wiring layer, the single crystal semiconductor layer, the gate insulating layer and the gate electrode; and a second wiring layer over the third insulating layer. The first wiring layer and the impurity region of the single crystal semiconductor layer are electrically connected to each other, and the first wiring layer and the second wiring layer are electrically connected to each other.

According to another feature of a semiconductor device of the present invention, the semiconductor device includes: a first insulating layer over an insulating substrate; a first wiring layer and a first electrode which are selectively formed on the first insulating layer; a second insulating layer formed in a region other than a region in which the first wiring layer and the first electrode are formed, on the first insulating layer; a single crystal semiconductor layer including a channel region and an impurity region, on the first wiring layer and the second insulating layer; a gate electrode over the channel region of the single crystal semiconductor layer with a gate insulating layer interposed therebetween; a second electrode over the first electrode with the gate insulating layer interposed therebetween; a third insulating layer covering the first wiring layer, the single crystal semiconductor layer, the gate insulating layer, the gate electrode, and the second electrode; and a second wiring layer over the third insulating layer. The first wiring layer and the impurity region of the single crystal semiconductor layer are electrically connected to each other, and the first wiring layer and the second wiring layer are electrically connected to each other.

In the above devices, the second wiring layer is formed in contact with the third insulating layer and is electrically connected to an impurity region of a single crystal semiconductor layer which is different from the above-described single crystal semiconductor layer through an opening in the third insulating layer. In addition, the first insulating layer preferably has a stacked structure including a layer containing any of silicon oxide, silicon nitride, silicon oxynitride, or silicon nitride oxide.

According to one feature of a manufacturing method of a semiconductor device of the present invention, the method includes: forming a damaged region in a single crystal semiconductor substrate by irradiation of the single crystal semiconductor substrate with ions; selectively forming a first wiring layer on a surface of the single crystal semiconductor substrate; forming a first insulating layer in a region other than a region in which the first wiring layer is formed, on the surface of the single crystal semiconductor substrate; forming a second insulating layer over the first wiring layer and the first insulating layer; bonding the second insulating layer and an insulating substrate to each other; separating the single crystal semiconductor substrate at the damaged region to form a stack of the first wiring layer and a single crystal semiconductor layer over the insulating substrate; patterning the single crystal semiconductor layer to expose part of the first wiring layer; forming a gate electrode over the patterned single crystal semiconductor layer with a gate insulating layer interposed therebetween; forming a third insulating layer over the patterned single crystal semiconductor layer, the gate insulating layer, the gate electrode, and the first wiring layer; forming an opening in the third insulating layer to expose part of the first wiring layer; and forming a second wiring layer electrically connected to the first wiring layer through the opening, over the third insulating layer.

According to another feature of a manufacturing method of a semiconductor device of the present invention, the method includes: forming a damaged region in a single crystal semiconductor substrate by irradiation of the single crystal semiconductor substrate with ions; selectively forming a first wiring layer and a first electrode on a surface of the single crystal semiconductor substrate; forming a first insulating layer in a region other than a region in which the first wiring layer and the first electrode are formed, on the surface of the single crystal semiconductor substrate; forming a second insulating layer over the first wiring layer, the first electrode, and the first insulating layer; bonding the second insulating layer and an insulating substrate to each other; separating the single crystal semiconductor substrate at the damaged region to form a stack of the first wiring layer and a single crystal semiconductor layer over the insulating substrate; patterning the single crystal semiconductor layer to expose the first electrode and part of the first wiring layer; forming a gate insulating layer over the patterned single crystal semiconductor layer, the exposed first electrode, and the exposed part of the first wiring layer; forming a gate electrode over the single crystal semiconductor layer with the gate insulating layer interposed therebetween; forming a second electrode over the first electrode with the gate insulating layer interposed therebetween; forming a third insulating layer covering the patterned single crystal semiconductor layer, the gate insulating layer, the gate electrode, the first wiring layer, and the second electrode; forming an opening in the third insulating layer to expose part of the first wiring layer; and forming a second wiring layer electrically connected to the first wiring layer, over the third insulating layer.

In the above-described methods, it is preferable that the single crystal semiconductor layer be irradiated with a laser beam before being patterned. In addition, an impurity element for controlling a threshold voltage may be selectively added into the single crystal semiconductor substrate before forming the first wiring layer.

In the above-described manner, using the present invention, an upper wiring layer and a lower wiring layer can be favorably connected to each other through a semiconductor element such as a transistor.

BRIEF DESCRIPTION OF THE DRAWINGS

In the accompanying drawings:

FIGS. 1A to 1F illustrate a manufacturing method of a semiconductor substrate;

DETAILED DESCRIPTION OF THE INVENTION

Figure 2A:
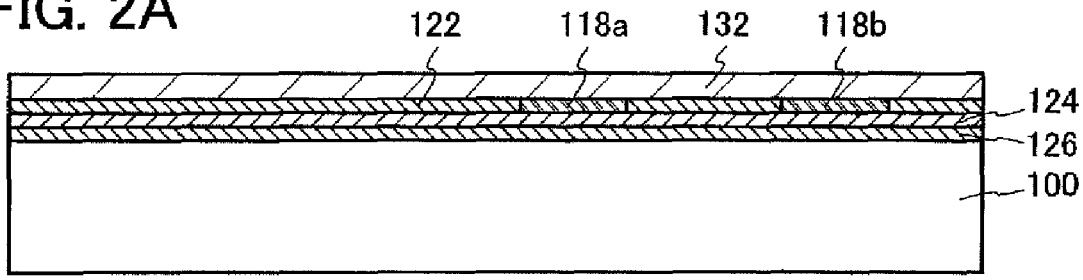
FIGS. 2A to 2D illustrate a manufacturing method of a semiconductor device.

Embodiment modes of the present invention will be described with reference to the drawings. However, the present invention is not limited to the following description. As is easily understood by a person skilled in the art, the mode and the detail of the present invention can be variously changed without departing from the spirit and the scope of the present invention. Thus, the present invention is not interpreted while limiting to the following description of the embodiment modes. In structures of the present invention described below, the same reference numerals are commonly given to the same components or components having similar functions throughout the drawings. In this specification, the semiconductor device indicates all devices that operate by utilizing semiconductor characteristics.

(Embodiment Mode 1)

In Embodiment Mode 1, an example of a manufacturing method of a semiconductor device according to the present invention will be described with reference to FIGS. 1A to 1F, FIGS. 2A to 2D, FIGS. 3A to 3D, FIGS. 4A and 4B, and FIGS. 5A to 5G. More specifically, a manufacturing method of an SOI substrate will be described with reference to FIGS. 1A to 1F, a manufacturing method of a semiconductor device will be described with reference to FIGS. 2A to 2D, FIGS. 3A to 3D, and FIGS. 4A and 4B, and a processing method of a substrate which is used for the SOI substrate will be described with reference to FIGS. 5A to 5G.

First, a manufacturing method of an SOI substrate will be described with reference to FIGS. 1A to 1F.

A base substrate 100 is prepared (see FIG. 1A). As the base substrate 100, a light-transmitting glass substrate used for liquid crystal display devices or the like can be used. As the glass substrate, a glass substrate having a strain point which is equal to or higher than 580° C. and equal to or lower than 680° C. (preferably, equal to or higher than 600° C. and equal to or lower than 680° C.) is preferably used. Further, it is preferable that the glass substrate be a non-alkali glass substrate. As a material of the non-alkali glass substrate, a glass material such as aluminosilicate glass, aluminoborosilicate glass, or barium borosilicate glass is used, for example.

Note that as the base substrate 100, a substrate made of an insulator such as a ceramic substrate, a quartz substrate, or a sapphire substrate; a substrate made of a semiconductor such as silicon; a substrate made of a conductor such as a metal or stainless steel; or the like can be used instead of a glass substrate.

Although not described in this embodiment mode, an insulating layer may be formed on a surface of the base substrate 100. In the case where impurities (such as an alkali metal or an alkaline earth metal) are included in the base substrate 100, by provision of the insulating layer, diffusion of the impurities into a semiconductor layer can be prevented. The insulating layer may have either a single-layer structure or a stacked structure. As a material for forming the insulating layer, silicon oxide, silicon nitride, silicon oxynitride, silicon nitride oxide, or the like can be used.

Note that in this specification, an oxynitride means the one that contains a larger amount (number of atoms) of oxygen than that of nitrogen and for example, silicon oxynitride includes oxygen, nitrogen, silicon, and hydrogen at concentrations ranging from greater than or equal to 50 at. % and less than or equal to 70 at. %, greater than or equal to 0.5 at. % and less than or equal to 15 at. %, greater than or equal to 25 at. % and less than or equal to 35 at. %, and greater than or equal to 0.1 at. % and less than or equal to 10 at. %, respectively. Further, a nitride oxide means the one that contains a larger amount (number of atoms) of nitrogen than that of oxygen and for example, silicon nitride oxide includes oxygen, nitrogen, silicon, and hydrogen at concentrations ranging from 5 at. % to 30 at. %, 20 at. % to 55 at. %, 25 at. % to 35 at. %, and 10 at. % to 25 at. %, respectively. The aforementioned ranges are ranges for cases measured using Rutherford backscattering spectrometry (RBS) and hydrogen forward scattering (HFS). Moreover, the total for the content ratio of the constituent elements does not exceed 100 at. %.

Next, a single crystal semiconductor substrate 110 is prepared. As the single crystal semiconductor substrate 110, a semiconductor substrate formed of a Group 4 element such as silicon, germanium, silicon germanium, or silicon carbide can be used. It is needless to say that a substrate made of a compound semiconductor such as gallium arsenide or indium phosphide may be used as well. In this embodiment mode, a single crystal silicon substrate is used as the substrate 110. Although there is no limitation on the size of the single crystal semiconductor substrate 110, for example, a circular semiconductor substrate having a diameter of 8 inches (200 mm), 12 inches (300 mm), or 18 inches (450 nm) can be processed into a rectangular shape for being used as the single crystal semiconductor substrate 110. In this specification, the "single crystal" means a crystal whose crystal structure has a certain regularity and in which the crystal axes are oriented in the same direction in any portion. That is, the "single crystal" is defined regardless of the number of defects.

The single crystal semiconductor substrate 110 is subjected to various treatments to form a damaged region 114, a wiring layer 118, an insulating layer 122, an insulating layer 124, and an insulating layer 126 (see FIG. 1B). The details of the various treatments will be described later. Note that the damaged region 114 is a region formed by irradiation with ions, and the single crystal semiconductor substrate 110 can be separated at the damaged region 114. Accordingly, the thickness of a single crystal semiconductor layer separated from the single crystal semiconductor substrate 110 is determined depending on the depth of the damaged region 114.

Since the insulating layer 126 is a layer providing a bonding surface in a bonding step, a surface of the insulating layer 126 preferably has high planarity. As the insulating layer 126, a silicon oxide film formed by a chemical vapor deposition method using an organosilane gas can be used, for example.

Then, the above-described base substrate 100 and the single crystal semiconductor substrate 110 are bonded to each other (see FIG. 1C). Specifically, after cleaning the surfaces of the base substrate 100 and the insulating layer 126 by a method such as ultrasonic cleaning, the surface of the base substrate 100 and the surface of the insulating layer 126 are disposed to be in contact with each other. Then, pressure treatment is performed so that the surface of the base substrate 100 and the surface of the insulating layer 126 are bonded to each other. Note that, as bonding mechanism, mechanism relating to van der Waals' force, mechanism relating to hydrogen bonding, or the like is conceivable.

Before the bonding step, the surface of the base substrate 100 or the surface of the insulating layer 126 may be subjected to oxygen plasma treatment or ozone treatment so as to be hydrophilic. By this treatment, a hydroxyl is added to the surface of the base substrate 100 or the surface of the insulating layer 126, so that a hydrogen bond can be formed at a bonding interface.

Next, the base substrate 100 and the single crystal semiconductor substrate 110, which are bonded to each other, are subjected to heat treatment to have a stronger bonding therebetween. The heat temperature at this time needs to be a temperature that does not promote separation at the damaged region 114. For example, a temperature lower than 400° C., more preferably equal to or lower than 300° C. can be employed. The heat treatment time is not particularly limited and the optimal condition may be determined as appropriate from the relation between the treatment speed and the bonding strength. In this embodiment mode, heat treatment is performed at 200° C. for two hours. Here, only the region where bonding is performed can be locally heated by irradiating the region with microwaves. Note that in the case where the bonding strength is sufficient, the above heat treatment may be omitted.

Next, the single crystal semiconductor substrate 110 is separated into a single crystal semiconductor layer 128 and a single crystal semiconductor substrate 130 at the damaged region 114 (see FIG. 1D). The separation of the single crystal semiconductor substrate 110 is caused by heat treatment. The temperature of the heat treatment can be determined in consideration of the allowable temperature limit of the base substrate 100. For example, in the case of using a glass substrate as the base substrate 100, the heat temperature is preferably equal to or higher than 400° C. and equal to or lower than the allowable temperature limit of the base substrate 100. Note that in this embodiment mode, heat treatment is performed at 600° C. for two hours.

By performing the heat treatment as described above, the volume of microvoids formed in the damaged region 114 is changed, thereby generating a crack in the damaged region 114. Consequently, the single crystal semiconductor substrate 110 is separated along the damaged region 114. Since the insulating layer 126 is bonded to the base substrate 100, the single crystal semiconductor layer 128 separated from the single crystal semiconductor substrate 110 remains over the base substrate 100. In addition, since the bonding interface between the base substrate 100 and the insulating layer 126 is heated by this heat treatment, a covalent bond is formed at the bonding interface so that the bonding force between the base substrate 100 and the insulating layer 126 is further improved.

In the semiconductor substrate formed in the above-described manner, defects due to the separation step or the ion irradiation step exist in the surface of the single crystal semiconductor layer 128, and planarity of the surface is damaged. It is difficult to form a thin gate insulating layer having a high withstand voltage on such a surface having roughness of the single crystal semiconductor layer 128. Therefore, planarization treatment is performed on the single crystal semiconductor layer 128. Further, treatment for reducing the defects in the single crystal semiconductor layer 128 is performed because defects in the single crystal semiconductor layer 128 have an adverse effect on performance and reliability of a transistor, such as increase of the localized state density at the interface between the single crystal semiconductor layer 128 and a gate insulating layer.

In this embodiment mode, improvement in planarity and reduction in defects of the single crystal semiconductor layer 128 can be realized by irradiation of the single crystal semiconductor layer 128 with a laser beam 142 (see FIG. 1E). By irradiation with the laser beam 142 from the top surface side of the single crystal semiconductor layer 128, the top surface of the single crystal semiconductor layer 128 is melted. The single crystal semiconductor layer 128 is cooled and becomes solidified after the melting, whereby a single crystal semiconductor layer with improved planarity of the top surface can be obtained. In this embodiment mode, since the laser beam 142 is used, the base substrate 100 is not directly heated. That is, the temperature increase of the base substrate 100 can be suppressed. Therefore, a low-heat-resistant substrate such as a glass substrate can be used as the base substrate 100. Needless to say, heating at a temperature which is equal to or lower than an allowable temperature limit of the base substrate may be performed as well. By heating the base substrate, reduction of defects can effectively be proceeded even in the case where a laser beam with a relatively low energy density is used.

Note that it is preferable that the single crystal semiconductor layer 128 be partially melted by the irradiation with the laser beam 142. This is because, if the single crystal semiconductor layer 128 is completely melted, there is a high possibility that the crystallinity of the single crystal semiconductor layer 128 may be lowered by microcrystallization due to disordered nucleation in the single crystal semiconductor layer 128 in a liquid phase. On the other hand, by partial melting, crystal is grown from a solid phase portion which is not melted. Accordingly, defects in the semiconductor layer can be reduced. Here, complete melting means that the single crystal semiconductor layer 128 is melted to the lower interface to be made in a liquid state. On the other hand, partial melting means that the upper part of the single crystal semiconductor layer 128 is melted to be made in a liquid phase whereas the lower part is kept in a solid phase without being melted.

For the above-described irradiation with the laser beam, a pulsed laser is preferably used. This is because the pulsed laser can instantaneously emit a pulsed laser beam with high energy and a partial melting state can be easily produced. The repetition rate is preferably equal to or higher than 1 Hz and equal to or lower than 10 MHz, and more preferably equal to or higher than 10 Hz and equal to or lower than 1 MHz. As the pulsed laser, an Ar laser, a Kr laser, an excimer (ArF, KrF, XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti:sapphire laser, a copper vapor laser, a gold vapor laser, or the like can be used. It is preferable that a pulsed laser be used for partial melting; however, the present invention is not limited thereto. That is, usage of a continuous wave laser is not excluded. As a continuous wave laser, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, or the like can be used.

It is necessary that the wavelength of the laser beam 142 be set to a wavelength which can be absorbed by the single crystal semiconductor layer 128. The wavelength may be determined in consideration of the skin depth of the laser beam and the like. For example, the wavelength can be set in the range of 250 nm to 700 nm inclusive. Further, the energy density of the laser beam 142 can be determined in consideration of the wavelength of the laser beam 142, the skin depth of the laser beam, the thickness of the single crystal semiconductor layer 128, or the like. For example, the energy density of the laser beam 142 may be set in the range of 300 mJ/cm$^2$ to 800 mJ/cm$^2$ inclusive. The aforementioned range of the energy density is an example in the case of using a XeCl excimer laser (wavelength: 308 nm) as a pulsed laser.

The irradiation with the laser beam 142 can be performed in an atmosphere containing oxygen such as an air atmosphere or an inert atmosphere such as a nitrogen atmosphere. In order to perform irradiation with the laser beam 142 in an inert atmosphere, the irradiation with the laser beam 142 may be performed in an airtight chamber while the atmosphere in the chamber may be controlled. In the case of not using the chamber, a nitrogen atmosphere can be formed by blowing an inert gas such as a nitrogen gas to the surface which is irradiated with the laser beam 142.

Note that the inert atmosphere such as nitrogen has higher effect of improving planarity of the single crystal semiconductor layer 128 than the air atmosphere. In addition, the inert atmosphere has higher effect of suppressing generation of cracks and ridges than the air atmosphere, and the applicable energy density range for the laser beam 142 is widened. The irradiation with the laser beam 142 may be performed in vacuum. In the case of irradiation with the laser beam 142 in vacuum, the same effect as the case of irradiation in an inert atmosphere can be obtained.

After irradiation with the laser beam 142 in the above-described manner, a thinning step in which the thickness of the single crystal semiconductor layer 128 is reduced may be performed. For thinning of the single crystal semiconductor layer 128, dry etching, wet etching, or a combination of the both etchings (etch-back treatment) may be performed. For example, in the case where the single crystal semiconductor layer 128 is a layer formed using a silicon material, the single crystal semiconductor layer 128 can be thinned by dry etching treatment using $SF_6$ and $O_2$ for a process gas.

Note that, although the etching treatment may be performed after planarization by laser beam irradiation in this embodiment mode, the present invention is not limited thereto. For example, etching treatment may be performed before laser beam irradiation. In this case, roughness or defects in the surface of the semiconductor layer can be reduced to some extent by the etching treatment. Alternatively, the etching treatment may be performed before and after the laser beam irradiation. Further alternatively, the laser beam irradiation and the etching treatment may be alternately repeated. By using laser beam irradiation and etching treatment in combination as described above, roughness, defects, and the like of the surface of the semiconductor layer can be significantly reduced. It is needless to say that the above etching treatment, the heat treatment, and the like need not always be used.

In the foregoing manner, an SOI substrate including a single crystal semiconductor layer 132 having improved planarity of the surface and reduced defects can be manufactured (see FIG. 1F).

Next, a manufacturing method of a semiconductor device using the above-described SOI substrate will be described with reference to FIGS. 2A to 2D, FIGS. 3A to 3D, and FIGS. 4A and 4B. Here, a manufacturing method of a semiconductor device including a plurality of transistors will be described as an example.

FIG. 2A is an enlarged cross-sectional view of part of the above-described SOI substrate. As is seen from FIG. 2A, a wiring layer 118a and a wiring layer 118b are provided below the single crystal semiconductor layer 132 and in contact with the single crystal semiconductor layer 132.

An impurity element imparting p-type conductivity such as boron, aluminum, or gallium or an impurity element imparting n-type conductivity such as phosphorus or arsenic may be added into the single crystal semiconductor layer 132 in order to control the threshold voltage of transistors. The region to which the impurity element is added and the kind of the impurity element can be changed as appropriate. For example, an impurity element imparting p-type conductivity can be added into a region for forming an n-channel transistor, and an impurity element imparting n-type conductivity can be added into a region for forming a p-channel transistor.

Figure 2B:
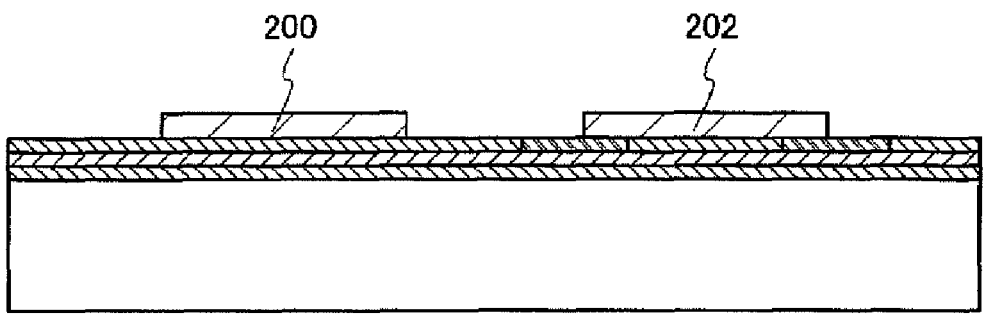

The single crystal semiconductor layer 132 is subjected to etching treatment to be separated into island shapes to form a single crystal semiconductor layer 200 and a single crystal semiconductor layer 202 (see FIG. 2B). Here, portions of the single crystal semiconductor layer, which exist over the wiring layers, are removed so that surfaces of the wiring layers are partially exposed. In the region other than the exposed region, connection between the wiring layers and the single crystal semiconductor layer is kept. In this embodiment mode, the wiring layers 118a and 118b are in contact with the single crystal semiconductor layer 202, and the surfaces of the wiring layers 118a and 118b are partially exposed; however, the present invention is not limited to this.

In FIG. 2B, the single crystal semiconductor layer 200 and the single crystal semiconductor layer 202 having the same size are illustrated. However, FIG. 2B is merely a schematic view and the single crystal semiconductor layer 200 and the single crystal semiconductor layer 202 are not limited to having the same size. The sizes of the single crystal semiconductor layer 200 and the single crystal semiconductor layer 202 can be changed as appropriate in accordance with characteristics of aimed semiconductor elements.

Figure 2C:
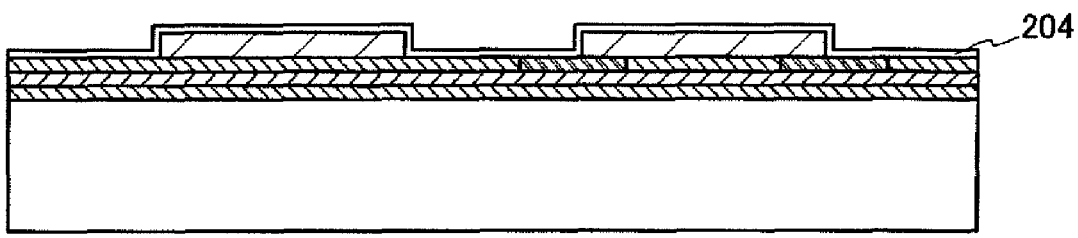

Next, a gate insulating layer 204 is formed to cover the single crystal semiconductor layer 200 and the single crystal semiconductor layer 202 (see FIG. 2C). Here, a single layer of silicon oxide film is formed by a plasma CVD method. Alternatively, the gate insulating layer 204 may be formed to have a single-layer structure or a stacked structure using a film including silicon oxynitride, silicon nitride oxide, silicon nitride, hafnium oxide, aluminum oxide, tantalum oxide, or the like.

As a formation method instead of the plasma CVD method, a sputtering method, or an oxidation or nitridation method using high-density plasma treatment can be given. High-density plasma treatment is performed by using, for example, a mixed gas of a rare gas such as helium, argon, krypton, or xenon; and a gas such as oxygen, nitrogen oxide, ammonia, nitrogen, or hydrogen. In this case, by exciting plasma by introduction of microwaves, plasma with a low electron temperature and a high density can be generated. When the surfaces of the semiconductor layers are oxidized or nitrided by oxygen radicals (OH radicals may be included) or nitrogen radicals (NH radicals may be included) which are produced by such high-density plasma, an insulating layer having a thickness equal to or greater than 1 nm and equal to or less than 20 nm, desirably equal to or greater than 2 nm and equal to or less than 10 nm can be formed. Since the oxidation or nitridation of the semiconductor layers by the above-described high-density plasma treatment is a solid-phase reaction, the high-density plasma treatment has a feature of drastically reducing the interface state density.

Further alternatively, the single crystal semiconductor layer 200 and the single crystal semiconductor layer 202 may be thermally oxidized to form the gate insulating layer 204. In the case of using such thermal oxidation, a base substrate having relatively high heat resistance is preferably used.

Figure 2D:
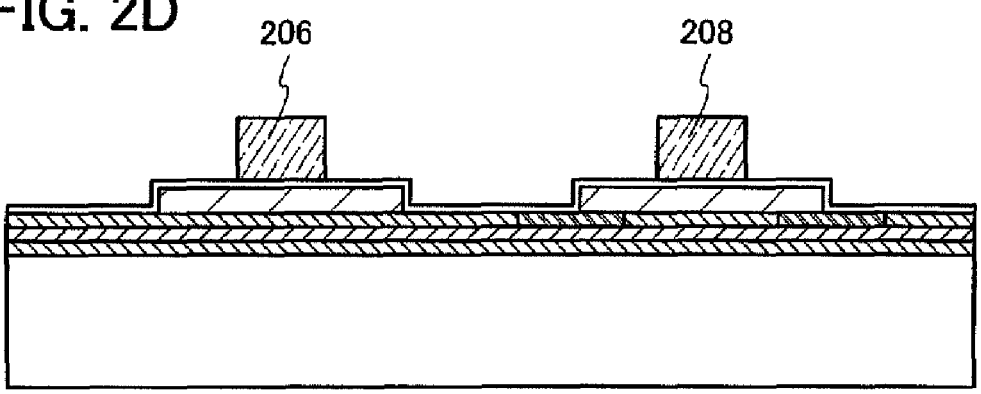

Next, after formation of a conductive layer over the gate insulating layer 204, the conductive layer is processed (patterned) into a predetermined shape to form a gate electrode 206 and a gate electrode 208 over the single crystal semiconductor layer 200 and the single crystal semiconductor layer 202, respectively (see FIG. 2D). The conductive layer can be formed by a CVD method, a sputtering method, or the like. The conductive layer can be formed using a material such as tantalum, tungsten, titanium, molybdenum, aluminum, copper, chromium, or niobium. Alternatively, an alloy material containing the above-described metal as its main component or a compound containing the above-described metal can also be used. Further alternatively, polycrystalline silicon which is obtained by doping a semiconductor layer with an impurity element that imparts a conductivity type, or the like may be used.

Although each of the electrodes 206 and 208 is formed of a single-layer conductive layer in this embodiment mode, the semiconductor device according to the present invention is not limited to this structure. In the case where the gate electrodes 206 and 208 have a two-layer structure, for example, a molybdenum film, a titanium film, a titanium nitride film, or the like may be used as a lower layer, and an aluminum film or the like may be used as an upper layer. In the case of a three-layer structure, a stacked structure of a molybdenum film, an aluminum film, and a molybdenum film; a stacked structure of a titanium film, an aluminum film, and a titanium film; or the like may be employed.

Figure 3A:
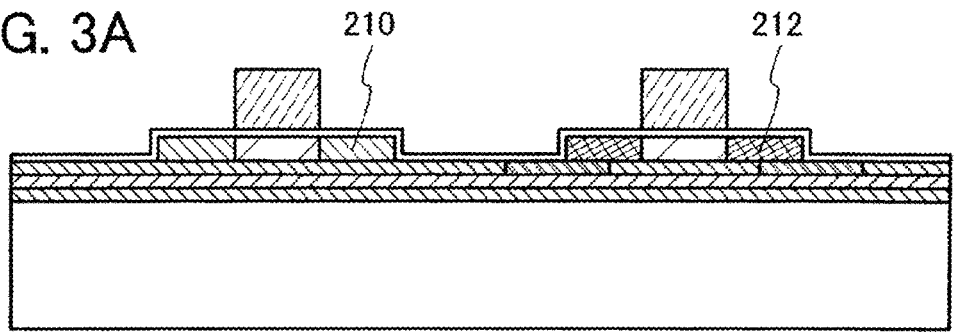
FIGS. 3A to 3D illustrate a manufacturing method of a semiconductor device.

Then, impurity elements each imparting one conductivity type are added into the single crystal semiconductor layer 200 and the single crystal semiconductor layer 202 using the gate electrodes 206 and 208 as masks (see FIG. 3A). In this embodiment mode, a case of adding an impurity element imparting n-type conductivity (e.g., phosphorus, arsenic, or the like) and an impurity element imparting p-type conductivity (e.g., boron or the like) into the single crystal semiconductor layer 200 and the single crystal semiconductor layer 202 respectively will be described; however, the present invention is not limited to this. In order to selectively perform addition of the impurity element imparting n-type conductivity and the impurity element imparting p-type conductivity, the single crystal semiconductor layer to be added with the p-type impurity element is covered with a mask when adding the n-type impurity element, and the single crystal semiconductor layer to be added with the n-type impurity element is covered with a mask when adding the p-type impurity element. Alternatively, after an impurity element imparting one of p-type and n-type conductivities is added to the all semiconductor layers, an impurity element imparting the other conductivity type may be added to part of the semiconductor layers at higher concentration. By the above-described addition of the impurity elements, impurity regions 210 are formed in the single crystal semiconductor layer 200 and impurity regions 212 are formed in the single crystal semiconductor layer 202.

Figure 3B:
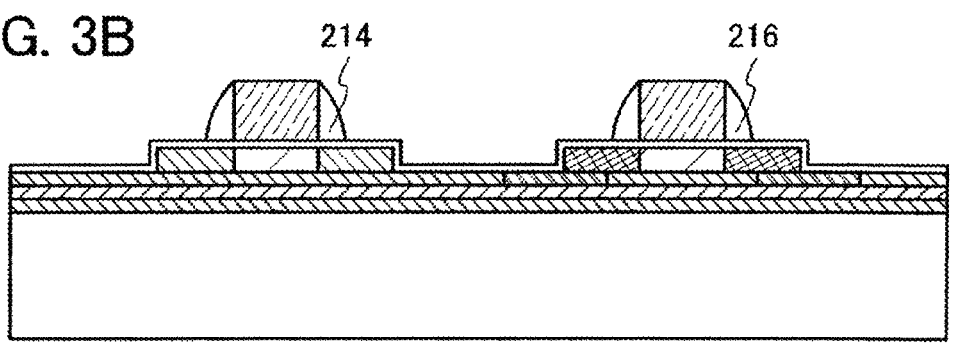

Next, sidewalls 214 and sidewalls 216 are formed on side surfaces of the gate electrode 206 and the gate electrode 208, respectively (see FIG. 3B). The sidewalls 214 and 216 can be formed, for example, in such a manner that an insulating layer is newly formed so as to cover the gate insulating layer 204 and the gate electrodes 206 and 208, and the newly formed insulating layer is subjected to anisotropic etching in which etching proceeds mainly in a perpendicular direction. Note that the gate insulating layer 204 may also be removed partially by the above-described anisotropic etching. For example, the gate insulating layer in a region other than the region located below the gate electrodes and the sidewalls can be removed. As the insulating layer for forming the sidewalls 214 and 216, a film including silicon, silicon oxide, silicon nitride, silicon oxynitride, silicon nitride oxide, an organic material, or the like may be formed to have a single-layer structure or a stacked structure by a plasma CVD method, a sputtering method, or the like. In this embodiment mode, a 100-nm-thick silicon oxide film is formed by a plasma CVD method. In addition, as an etching gas, a mixed gas of $CHF_3$ and helium can be used. Note that the steps for formation of the sidewalls 214 and 216 are not limited to the steps given here.

Figure 3C:
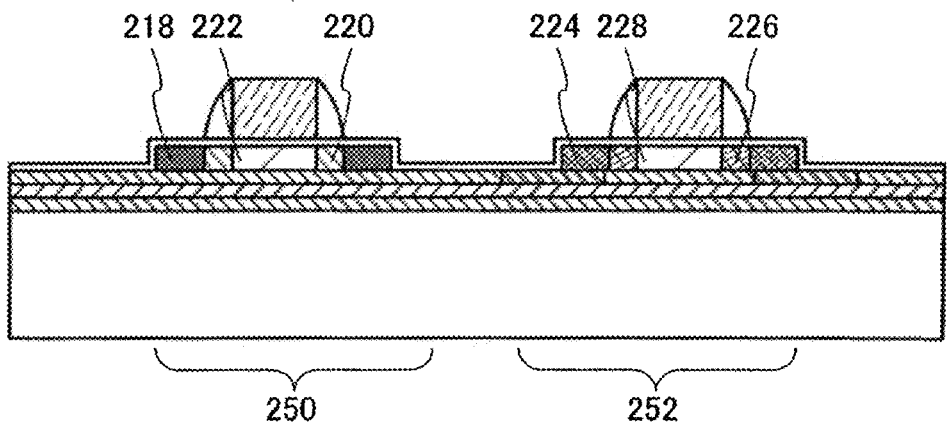

Then, an impurity element imparting one conductivity type is added into the single crystal semiconductor layer 200 using the gate electrode 206 and the sidewalls 214 as masks, and an impurity element imparting one conductivity type is added into the single crystal semiconductor layer 202 using the gate electrode 208 and the sidewalls 216 as masks (see FIG. 3C). Note that the impurity elements imparting the same conductivity types as the impurity elements which have been added to the single crystal semiconductor layer 200 and the single crystal semiconductor layer 202 in the previous step are added to the single crystal semiconductor layer 200 and the single crystal semiconductor layer 202 at higher concentrations than those in the previous step. Thus, a pair of high-concentration impurity regions 218, a pair of low-concentration impurity regions 220, and a channel region 222 are formed in the single crystal semiconductor layer 200, and a pair of high-concentration impurity regions 224, a pair of low-concentration impurity regions 226, and a channel region 228 are formed in the single crystal semiconductor layer 202. The high-concentration impurity regions 218 and 224 serve as source regions and drain regions, and the low-concentration impurity regions 220 and 226 serve as lightly doped drain (LDD) regions. Note that the wiring layers 118a and 118b are in contact with the high-concentration impurity regions 224. Needless to say, the wiring layers 118a and 118b may be provided to be in contact with the low-concentration impurity regions 226.

Figure 3D:
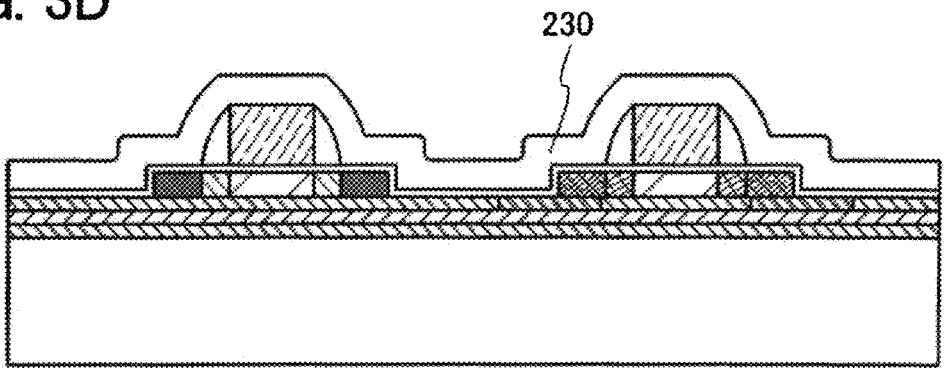

In FIGS. 3B to 3D, the sidewalls 214 formed over the single crystal semiconductor layer 200 and the sidewalls 216 formed over the single crystal semiconductor layer 202 which have the same size are illustrated. However, the drawings are merely schematic views and the present invention is not limited to this. Since the sizes of the LDD regions change in accordance with the sizes of the sidewalls, the sizes of the sidewalls 214 and the sidewalls 216 may be changed in accordance with required characteristics of transistors.

A silicide layer may be formed by siliciding part of the single crystal semiconductor layers 200 and 202 in order to further reduce the resistance of the source regions and the drain regions. The siliciding is performed in such a manner that a metal is brought into contact with the semiconductor layers, and silicon in the semiconductor layers is made to react with the metal by heating (e.g., heating using a GRTA method, an LRTA method, or the like). In this embodiment mode, since the wiring layers 118a and 118b are provided to be in contact with the single crystal semiconductor layer 202, part of the single crystal semiconductor layer 202 may be silicided using the wiring layers 118a and 118b. Further, a silicide layer can be formed by irradiation with a laser beam or the like. As a metal material used for forming silicide, titanium, nickel, tungsten, molybdenum, cobalt, zirconium, hafnium, tantalum, vanadium, neodymium, chromium, platinum, palladium, and the like can be given.

Through the foregoing process, an n-channel transistor 250 and a p-channel transistor 252 are formed using a single crystal semiconductor. Although wiring layers serving as a source electrode and a drain electrode have not been formed yet at the moment illustrated in FIG. 3C, the "transistor" may involve the wiring layers serving as a source electrode and a drain electrode in the structure.

Next, an insulating layer 230 is formed to cover the n-channel transistor 250 and the p-channel transistor 252 (see FIG. 3D). For example, the insulating layer 230 can be formed using a material such as silicon oxide, silicon nitride, silicon oxynitride, silicon nitride oxide, aluminum nitride, or aluminum oxide. Alternatively, the insulating layer 230 may be formed using an organic material having heat resistance such as polyimide, acrylic, benzocyclobutene, polyamide, or epoxy.

Next, contact holes are formed in the insulating layer 230 so as to expose part of the surface of the single crystal semiconductor layer 200. In addition, a contact hole is formed in the insulating layer 230 so as to expose part of the surface of the wiring layer 118a. Then, a wiring layer 232 and a wiring layer 234 which are in contact with the single crystal semiconductor layer 200 or the wiring layer 118a through the contract holes are formed (see FIG. 4A). Note that in this embodiment mode, as an etching gas for forming the contact holes, a mixed gas of $CHF_3$ and He is employed; however, the etching gas is not limited thereto. Although not described in this embodiment mode, contact holes may be formed to expose the surface of the wiring layer 118b, if needed.

The wiring layers 232 and 234 can be formed by a CVD method, a sputtering method, or the like. Specifically, any of the following materials can be used for the wiring layers 232 and 234: aluminum, tungsten, titanium, tantalum, molybdenum, nickel, platinum, copper, gold, silver, manganese, neodymium, carbon, silicon, and the like. Alternatively, an alloy containing the above-described material as its main component or a compound containing the above-described material may be used. The wiring layers 232 and 234 may have a single-layer structure or a stacked structure.

As an example of an alloy containing aluminum as its main component, an alloy containing aluminum as its main component and also containing nickel can be given. In addition, an alloy containing aluminum as its main component and also containing nickel and one or both of carbon and silicon can also be given as an example thereof. Since aluminum and aluminum silicon (Al—Si) have low resistance and are inexpensive, aluminum and aluminum silicon are suitable as a material for forming the wiring layers 232 and 234. In particular, the aluminum silicon is preferable because generation of a hillock can be suppressed. Further, a material in which Cu is mixed into aluminum at approximately 0.5% may be used instead of silicon.

In the case where each of the wiring layers 232 and 234 is formed to have a stacked structure, a stacked structure of a barrier film, an aluminum silicon film, and a barrier film; a stacked structure of a barrier film, an aluminum silicon film, a titanium nitride film, and a barrier film; or the like may be used, for example. Note that the barrier film refers to a film formed using titanium, a nitride of titanium, molybdenum, a nitride of molybdenum, or the like. When barrier films are formed to sandwich an aluminum silicon film, generation of a hillock can be suppressed more effectively. When a barrier film is formed using titanium that is a highly-reducible element, even if a thin oxide film is formed over the single crystal semiconductor layer 200 or the wiring layer 118a, the oxide film is reduced by titanium contained in the barrier film so that preferable contact between the wiring layer 232 and the single crystal semiconductor layer 200 and between the wiring layer 234 and the single crystal semiconductor layer 200 or the wiring layer 118a can be obtained. Further, a plurality of barrier films may be stacked as well. In that case, for example, each of the wiring layers 232 and 234 can be formed to have a five-layer structure including titanium, titanium nitride, aluminum silicon, titanium, and titanium nitride in this order from the bottom layer; or a stacked structure including more than five layers.

The wiring layer 232 is connected to the high-concentration impurity region 218 of the n-channel transistor 250. The wiring layer 234 is connected to the high-concentration impurity region 218 of the n-channel transistor 250 and the wiring layer 118a.

Figure 4A:
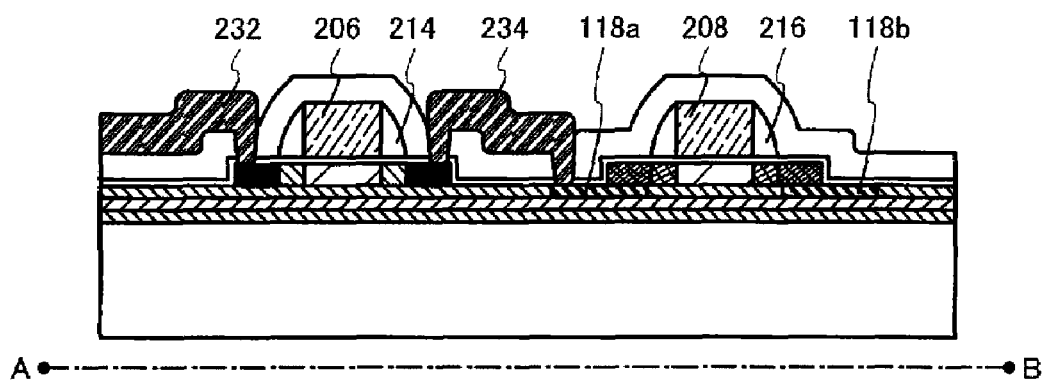
FIGS. 4A and 4B illustrate a manufacturing method of a semiconductor device.
Figure 4B:
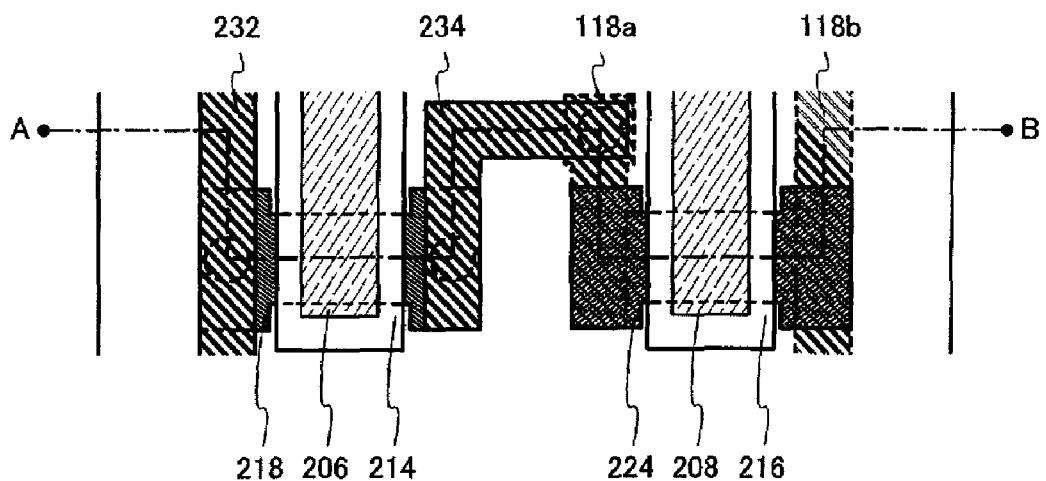

FIG. 4B is a plan view of the n-channel transistor 250 and the p-channel transistor 252 illustrated in FIG. 4A. Here, the cross section taken along a line A-B of FIG. 4B corresponds to FIG. 4A. Note that in FIG. 4B, part of components such as the gate insulating layer 204 and the insulating layer 230 are omitted for simplicity.

Note that although this embodiment mode describes the case where each of the n-channel transistor 250 and the p-channel transistor 252 includes one electrode serving as the gate electrode as an example, the present invention is not limited to this structure. The transistor manufactured in the present invention may have a multi-gate structure, in which a plurality of electrodes serving as gate electrodes are included and electrically connected to one another.

In the foregoing manner, a semiconductor device including a plurality of transistors can be manufactured.

Next, a processing method of a single crystal semiconductor substrate which is used for manufacturing an SOI substrate will be described with reference to FIGS. 5A to 5G.

Figure 5A:
FIGS. 5A to 5G illustrate a processing method of a semiconductor substrate.

First, the single crystal semiconductor substrate 110 is prepared (see FIG. 5A). For the detail of the single crystal semiconductor substrate 110, the description of the manufacturing method of a semiconductor substrate (with reference to FIGS. 1A to 1F) can be referred to; therefore, the detail of the single crystal semiconductor substrate 110 is omitted here.

After cleaning the single crystal semiconductor substrate 110, an insulating layer 112 is formed on a surface of the single crystal semiconductor substrate 110. It is also possible that the insulating layer 112 is not provided; however, the insulating layer 112 is preferably provided in order to prevent contamination and surface damage of the single crystal semiconductor substrate 110 due to later ion irradiation. The thickness of the insulating layer 112 is preferably equal to or greater than 10 nm and equal to or less than 400 nm.

As a material for the insulating layer 112, silicon oxide, silicon nitride, silicon oxynitride, silicon nitride oxide, and the like can be given. As a method for forming the insulating layer 112, a CVD method, a sputtering method, a method of oxidizing (or nitriding) the single crystal semiconductor substrate 110, or the like can be used.

Figure 5B:
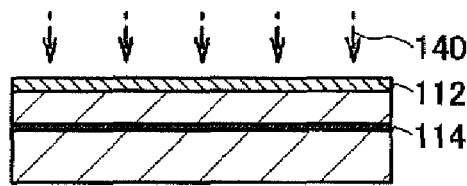

Next, an ion beam 140 including ions accelerated by an electric field is delivered to the single crystal semiconductor substrate 110 through the insulating layer 112, thereby forming the damaged region 114 in a region at a predetermined depth from the surface of the single crystal semiconductor substrate 110 (see FIG. 5B). The depth of the region where the damaged region 114 is formed can be controlled by the accelerating energy of the ion beam 140 and the incidence angle thereof. The damaged region 114 is formed at a depth the same or substantially the same as the average penetration depth of ions.

Depending on the depth at which the damaged region 114 is formed, the thickness of the single crystal semiconductor layer which is separated from the single crystal semiconductor substrate 110 is determined. The depth at which the damaged region 114 is formed from the surface of the single crystal semiconductor substrate 110 is equal to or greater than 50 nm and equal to or less than 500 nm, and preferably equal to or greater than 50 nm and equal to or less than 200 nm.

An ion implantation apparatus or an ion doping apparatus can be used in order to irradiate the single crystal semiconductor substrate 110 with ions. In an ion implantation apparatus, a source gas is excited to produce ion species, the produced ion species are mass-separated, and ion species having a predetermined mass is implanted into a processing object. In an ion doping apparatus, a process gas is excited to produce ion species, the produced ion species are not mass-separated and are added into a processing object. Note that in an ion doping apparatus provided with a mass separator, ion implantation with mass separation can be performed similarly to the ion implantation apparatus. In this specification, the use of either of an ion implantation apparatus and an ion doping apparatus is specified only when one of them definitely needs to be used, whereas in the case where there is no specific description, either of them may be used to perform ion irradiation.

The ion irradiation step in the case of using an ion doping apparatus can be performed in the following manner, for example.

Accelerating voltage: equal to or higher than 10 kV and equal to or lower than 100 kV (preferably equal to or higher than 30 kV and equal to or lower than 80 kV)

Dose: equal to or greater than $1 \times 10^{16}/cm^2$ and equal to or less than $4 \times 10^{16}/cm^2$ Beam current density: equal to or higher than 2 $\mu A/cm^2$ (preferably equal to or higher than 5 $\mu A/cm^2$, more preferably equal to or higher than 10 $\mu A/cm^2$)

In the case of using an ion doping apparatus, a gas containing hydrogen can be used as a source gas of the ion irradiation step. By using the gas, $H^+$, $H_2^+$, and $H_3^+$ can be produced as ion species. In the case where a hydrogen gas is used as a source gas, it is preferable to perform irradiation with a large amount of $H_3^+$. Specifically, it is preferably that the ion beam 140 contain $H_3^+$ ions at a proportion of 70% or higher with respect to the total number of $H^+$, $H_2^+$, and $H_3^+$ ions. It is more preferable that the proportion of $H_3^+$ ions be equal to or higher than 80%. With a high proportion of $H_3^+$ in this manner, the damaged region 114 can contain hydrogen at a concentration of $1 \times 10^{20}$ atoms/$cm^3$ or higher. Accordingly, separation at the damaged region 114 can be performed easily. By irradiation with a larger amount of $H_3^+$ ions, ion irradiation efficiency is improved compared to the case of irradiation with $H^+$ ions and $H_2^+$ ions. That is, time required for ion irradiation can be shortened. Moreover, with the use of $H_3^+$, the average penetration depth of ions can be made shallower; thus, the damaged region 114 can be formed at a shallower region.

In the case of using an ion implantation apparatus, it is preferable to perform mass separation to emit $H_3^+$ ions. Needless to say, irradiation with $H^+$ ions and $H_2^+$ ions may be performed as well. Note that, since ion species are selected to perform irradiation in the case of using an ion implantation apparatus, ion irradiation efficiency is decreased compared to the case of using an ion doping apparatus, in some cases.

As the source gas in the ion irradiation step, instead of a gas containing hydrogen, one or more kinds of gas selected from a rare gas such as helium or argon, a halogen gas typified by a fluorine gas or a chlorine gas, and a halogen compound gas such as a fluorine compound gas (e.g., $BF_3$) can be used. When helium is used for a source gas, an ion beam 140 with a high proportion of $He^+$ ions can be formed without mass separation. With the use of such an ion beam 140, the damaged region 114 can be efficiently formed.

Further, an ion irradiation step may be performed plural times to form the damaged region 114. In this case, the same source gas may be used in all ion irradiation steps or a different source gas may be used for each ion irradiation step. For example, ion irradiation may be performed using a rare gas as a source gas, and then, ion irradiation may be performed using a gas containing hydrogen as a source gas. Alternatively, ion irradiation may be performed first using a halogen gas or a halogen compound gas, and then, ion irradiation may be performed using a gas containing hydrogen.

Figure 5C:
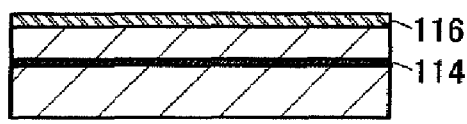

After formation of the above-described damaged region 114, the insulating layer 112 is removed and a conductive layer 116 to serve as a wiring layer later is formed (see FIG. 5C). The conductive layer 116 can be formed by a CVD method, a sputtering method, or the like. Specifically, the conductive layer can be formed using a material such as aluminum, tungsten, titanium, tantalum, molybdenum, nickel, chromium, niobium, platinum, copper, gold, silver, manganese, neodymium, carbon, or silicon. Alternatively, an alloy material containing the above-described material as its main component or a compound containing the above-described material may also be used. The conductive layer 116 may have a single-layer structure or a stacked structure.

Figure 5D:

Then, the conductive layer 116 is processed (patterned) into a predetermined shape, thereby forming the wiring layer 118 (see FIG. 5D). For the manufacturing steps of the conductive layer 116 and the wiring layer 118, the manufacturing steps of the gate electrodes 206 and 208 and the wiring layers 232 and 234 may be referred to.

Figure 5E:

Next, an insulating layer 120 is formed to cover the wiring layer 118 (see FIG. 5E). As a material for forming the insulating layer 120, an insulating material containing silicon or germanium as a composition, such as silicon oxide, silicon nitride, silicon oxynitride, silicon nitride oxide, germanium oxide, germanium nitride, germanium oxynitride, or germanium nitride oxide can be used. Alternatively, an oxide of metal such as aluminum oxide, tantalum oxide, or hafnium oxide; a nitride of metal such as aluminum nitride; an oxynitride of metal such as aluminum oxynitride; or a nitride oxide of metal such as aluminum nitride oxide may be used. As a formation method of the insulating layer 120, there is a CVD method, a sputtering method, or the like.

Figure 5F:
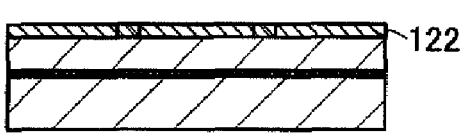

Then, an insulating layer 122 is formed by planarizing the surface of the insulating layer 120 (see FIG. 5F). In order to form a planar layer used for later the bonding step, it is preferable that the insulating layer 120 be planarized. As an example of the planarization method, etching treatment (etch-back treatment) can be given. The etching treatment may be performed by dry etching, wet etching, or a combination of the both etchings. In addition to the above etching treatment, planarization by polishing (CMP or the like) can also be performed. Needless to say, only polishing may be performed as well. In this embodiment mode, the surface of the wiring layer 118 and the surface of the insulating layer 122 are in the same plane; however, the present invention is not limited to this. For example, the wiring layer 118 may be covered with the insulating layer 122.

Figure 5G:
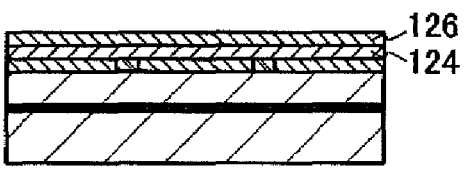

Next, the insulating layer 124 and the insulating layer 126 are formed over the insulating layer 122 (see FIG. 5G). The insulating layer 124 is preferably formed using a material which can suppress entry of an impurity element into the semiconductor layer. As such a material, silicon nitride, silicon nitride oxide, aluminum nitride, aluminum nitride oxide, and the like can be given, for example. Needless to say, silicon oxide, silicon oxynitride, or other insulating materials may also be used.

Since the insulating layer 126 is a layer for forming a bond in attaching, the surface of the insulating layer 126 preferably has high planarity. As the insulating layer 126, a silicon oxide film formed by a chemical vapor deposition method using an organosilane gas can be used, for example. Alternatively, a silicon nitride film may be used.

Although the two-layer structure of insulating layers is employed over the insulating layer 122 in this embodiment mode, the present invention is not limited to this. A single-layer structure or a stacked structure of three or more layers may also be employed.

In the foregoing manner, a single crystal semiconductor substrate used for manufacturing a semiconductor substrate can be obtained.

(Embodiment Mode 2)

In Embodiment Mode 2, another example of a processing method of a single crystal semiconductor substrate will be described. Note that the processing method of a single crystal semiconductor substrate in this embodiment mode and the processing method of a single crystal semiconductor substrate in Embodiment Mode 1, which is described with reference to FIGS. 5A to 5G, have a lot in common. Therefore, only different points from Embodiment Mode 1 will be described in this embodiment mode.

Figure 6A:
FIGS. 6A to 6G illustrate a processing method of a semiconductor substrate.
Figure 6B:
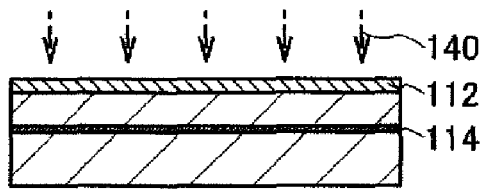

Since the process until the damaged region 114 is formed in the single crystal semiconductor substrate 110 (see FIGS. 6A and 6B) is the same as that in Embodiment Mode 1, description thereof is omitted here.

Figure 6C:

After formation of the damaged region 114, the insulating layer 112 is removed and the insulating layer 120 is newly formed (see FIG. 6C). The insulating layer 112 is removed here because there is a high possibility that the insulating layer 112 may be damaged due to irradiation with ions. If damage of the insulating layer 112 does not cause any problems, it is not necessary to remove the insulating layer 112. In this case, the insulating layer 120 may be newly formed over the insulating layer 112, or only the insulating layer 112 may be formed without formation of the insulating layer 120.

As a material included in the insulating layer 120, an insulating material containing silicon or germanium as a composition, such as silicon oxide, silicon nitride, silicon oxynitride, silicon nitride oxide, germanium oxide, germanium nitride, germanium oxynitride, or germanium nitride oxide can be used. Alternatively, an oxide of metal such as aluminum oxide, tantalum oxide, or hafnium oxide; a nitride of metal such as aluminum nitride; an oxynitride of metal such as aluminum oxynitride; or a nitride oxide of metal such as aluminum nitride oxide may be used. As a formation method of the insulating layer 120, there is a CVD method, a sputtering method, or the like.

Figure 6D:

Next, the insulating layer 120 is patterned into a predetermined shape to form the insulating layer 122 in which grooves (openings) are formed (see FIG. 6D). The grooves are regions in which a wiring layer is formed later. Therefore, the depth of the grooves needs to be such a depth as to reach the single crystal semiconductor substrate in at least one region.

Figure 6E:
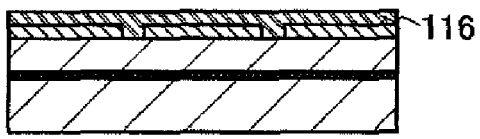

Then, the conductive layer 116 to be a wiring layer is formed (see FIG. 6E). The conductive layer 116 can be formed by a CVD method, a sputtering method, or the like. Specifically, the conductive layer can be formed using a material such as aluminum, tungsten, titanium, tantalum, molybdenum, nickel, chromium, niobium, platinum, copper, gold, silver, manganese, neodymium, carbon, or silicon. Alternatively, an alloy containing the above-described material as its main component or a compound containing the above-described material may be used. The conductive layer 116 may have a single-layer structure or a stacked structure.

Figure 6F:
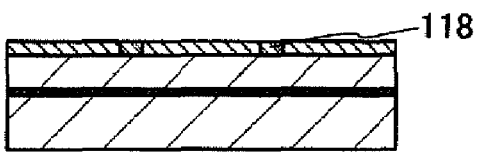

Then, the conductive layer 116 is partially removed along with planarization of the surface of the conductive layer 116; accordingly, the wiring layer 118 is formed (see FIG. 6F). Specifically, the conductive layer 116 is polished until the surface of the insulating layer 122 is exposed. Thus, the conductive layer 116 is partially removed and, accordingly, the wiring layer 118 can be formed in the grooves of the insulating layer 122. As another example of the planarization step, etching treatment (etch-back treatment) can be given. The etching treatment may be performed by dry etching, wet etching, or a combination of the both etchings. In addition to the above etching treatment, planarization by CMP can also be performed.

Figure 6G:
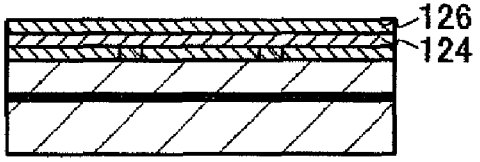

Since the steps of forming the insulating layer 124 and the insulating layer 126 (see FIG. 6G) are the same as those in Embodiment Mode 1, the description thereof is omitted here. In the foregoing manner, a single crystal semiconductor substrate used for manufacturing an SOI substrate can be obtained.

This embodiment mode can be implemented in combination with any of the above embodiment modes as appropriate.

(Embodiment Mode 3)

In Embodiment Mode 3, a semiconductor device and a manufacturing method thereof, which are different from those of the above embodiment mode, will be described with reference to FIGS. 7A to 7E.

Figure 7A:
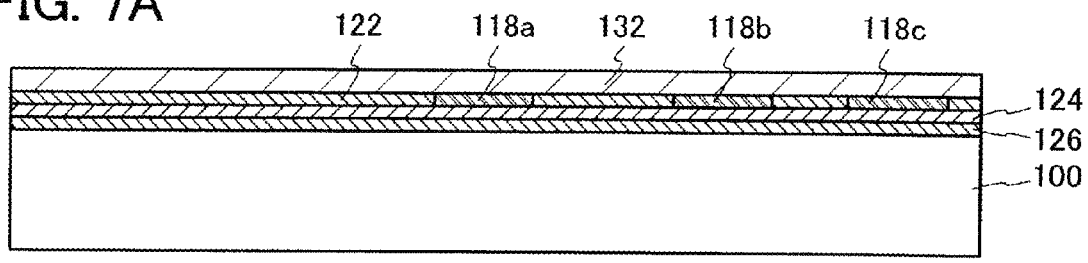
FIGS. 7A to 7E illustrate a manufacturing method of a semiconductor device.

First, a semiconductor substrate is manufactured as illustrated in FIGS. 1A to 1F (see FIG. 7A). Here, the wiring layers 118a and 118b and a first electrode 118c are provided below the single crystal semiconductor layer 132. The wiring layers 118a and 118b and the first electrode 118c can be provided in the same step.

Figure 7B:
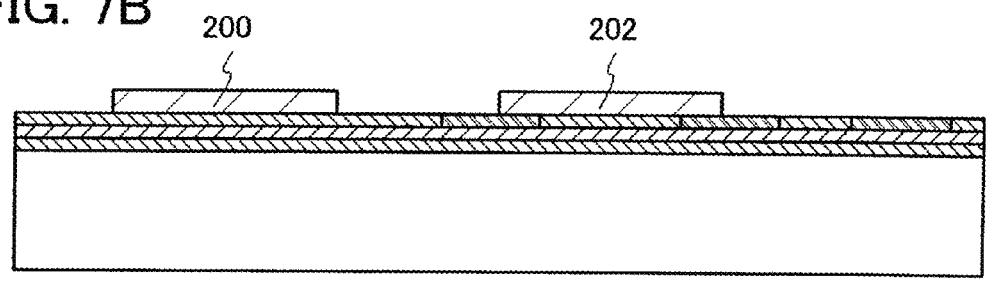

Next, the single crystal semiconductor layer 132 is subjected to etching treatment to be separated into an island shape; thus, the single crystal semiconductor layer 200 and the single crystal semiconductor layer 202 are formed (see FIG. 7B).

Here, portions of the single crystal semiconductor layer 132, which exist over the wiring layers 118a and 118b, are removed so that the surfaces of the wiring layers 118a and 118b are partially exposed. In addition, a portion of the single crystal semiconductor layer 132, which exists over the first electrode 118c, is removed so that the first electrode 118c is exposed. In the region other than the exposed region, connection between the wiring layers 118a and 118b and the single crystal semiconductor layer is kept. In this embodiment mode, the wiring layers 118a and 118b are in contact with the single crystal semiconductor layer 202, and the surfaces of the wiring layers 118a and 118b are partially exposed; however, the present invention is not limited to this.

Figure 7C:
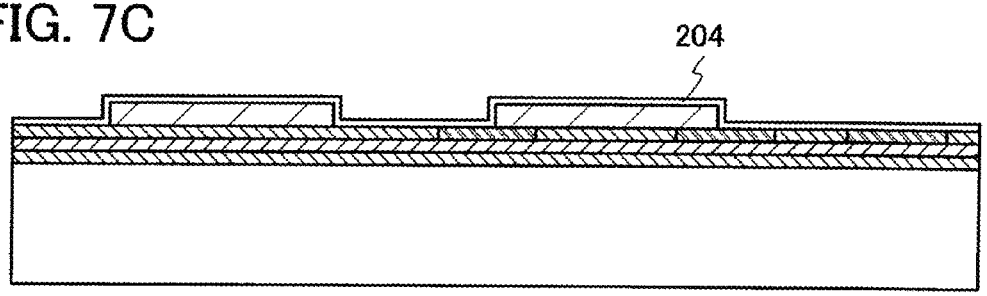
Figure 7D:
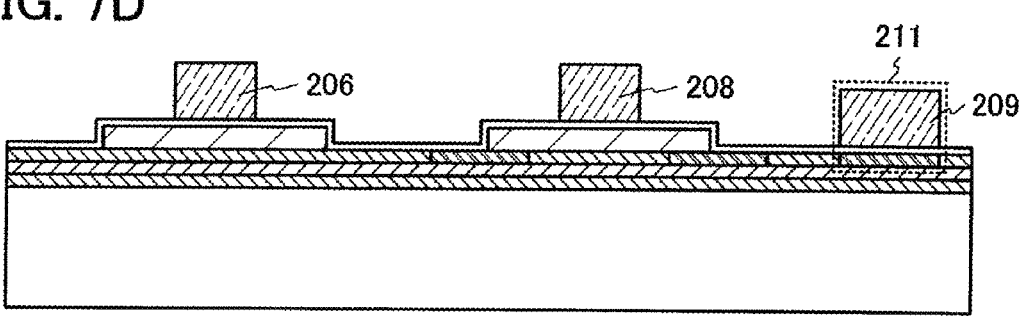

Next, the gate insulating layer 204 is formed to cover the single crystal semiconductor layer 200 and the single crystal semiconductor layer 202 (see FIG. 7C). The gate insulating layer 204 is formed also over the first electrode 118c. Here, a single-layer silicon oxide film is formed by a plasma CVD method. Alternatively, the gate insulating layer 204 may be formed to have a single-layer structure or a stacked structure using a film including silicon oxynitride, silicon nitride oxide, silicon nitride, hafnium oxide, aluminum oxide, tantalum oxide, or the like.

Then, a conductive layer is formed over the gate insulating layer 204 and then processed (patterned) into a predetermined shape. Thus, the gate electrode 206 and the gate electrode 208 are formed over the single crystal semiconductor layer 200 and the single crystal semiconductor layer 202, respectively, with the gate insulating layer 204 interposed therebetween, and a second electrode 209 is formed over the first electrode 118c with the gate insulating layer 204 interposed therebetween (see FIG. 7D).

A capacitor 211 can be provided with the stacked structure of the first electrode 118c, the gate insulating layer 204, and the second electrode 209. Since the capacitor 211 can use the gate insulating layer 204 having a small thickness as an insulating layer for forming the capacitor, compared to the case of using an insulating layer formed over a transistor, an equivalent capacity can be obtained even the size of the capacitor is reduced.

The conductive layer can be formed by a CVD method, a sputtering method, or the like. The conductive layer can be formed using a material such as tantalum, tungsten, titanium, molybdenum, aluminum, copper, chromium, or niobium. Alternatively, an alloy material containing the above-described metal as its main component or a compound containing the above-described metal can also be used. Further alternatively, polycrystalline silicon which is obtained by doping a semiconductor layer with an impurity element that imparts a conductivity type, or the like may be used.

Figure 7E:
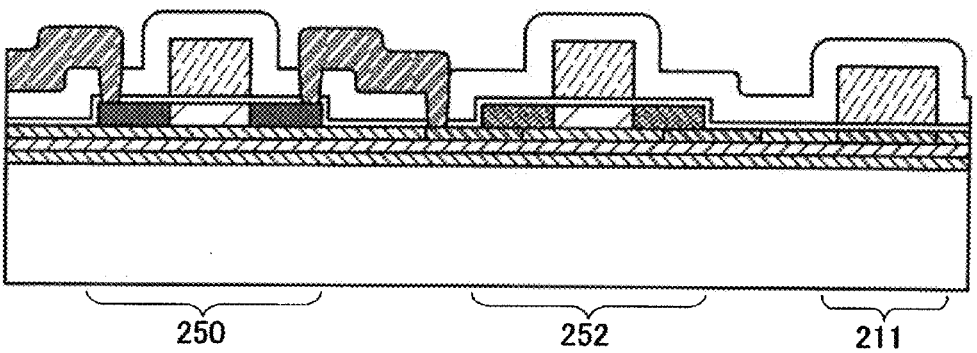

Then, the process similar to the steps of FIGS. 3A to 3D and FIGS. 4A and 4B is performed, so that a semiconductor device which includes a plurality of transistors (the n-channel transistor 250 and the p-channel transistor 252) and the capacitor 211 can be manufactured (see FIG. 7E). Note that although the structure in which sidewalls are not provided is described in this embodiment mode, the structure in which sidewalls are provided as in Embodiment Mode 1 may be employed as well.

In this embodiment mode, as well as the wiring layer, the first electrode for forming the capacitor is provided in a layer lower than the transistors and a gate insulating layer having a small thickness, which is formed over the first electrode, is used as an insulating film for forming the capacitor. Thus, the size of the capacitor can be reduced and a semiconductor device can be miniaturized.

Note that this embodiment mode can be implemented in combination with any of the above embodiment modes as appropriate.

(Embodiment Mode 4)

In Embodiment Mode 4, a semiconductor device and a manufacturing method thereof, which are different from those of the above embodiment modes, will be described with reference to FIGS. 8A to 8E.

First, a single crystal semiconductor substrate is processed as illustrated in FIGS. 5A to 5G (or FIGS. 6A to 6G). In this embodiment mode, before formation of the conductive layer 116 as in FIGS. 5A to 5G (or FIGS. 6A to 6G), an impurity element is added for controlling the threshold voltage of transistors to be completed later. In this embodiment mode, an impurity element imparting p-type conductivity is selectively added into a region for forming an n-channel transistor, and an impurity element imparting n-type conductivity is selectively added into a region for forming a p-channel transistor. Thus, impurity elements are added into the single crystal semiconductor substrate 110 at a low concentration. At this time, the addition is performed in such a manner that the concentration is high in the vicinity of the surface of the single crystal semiconductor substrate 110. In other words, impurity elements are added so that a region 134 (p-type impurity region) and a region 136 (n-type impurity region) each of which has a relatively high impurity concentration are formed in the vicinity of the surface of the single crystal semiconductor substrate 110 (see FIG. 8A). Note that the region 134 and the region 136 are illustrated only schematically, and it is needless to say that the actual impurity concentration varies continuously.

The above addition of the impurity elements may be performed before or after formation of the damaged region 114. As the impurity element, an impurity element imparting p-type conductivity such as boron, aluminum, or gallium or an impurity element imparting n-type conductivity such as phosphorus or arsenic may be used.

Figure 8A:
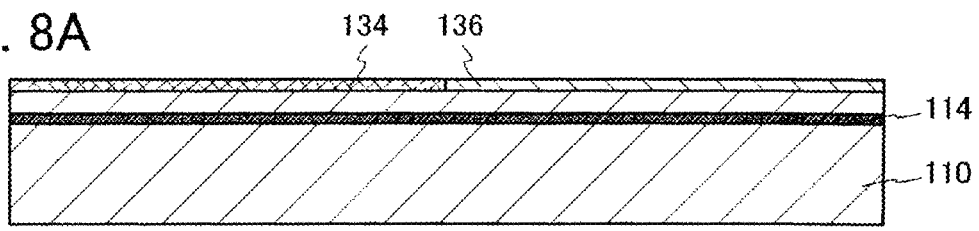
FIGS. 8A to 8E illustrate a manufacturing method of a semiconductor device.
Figure 8B:
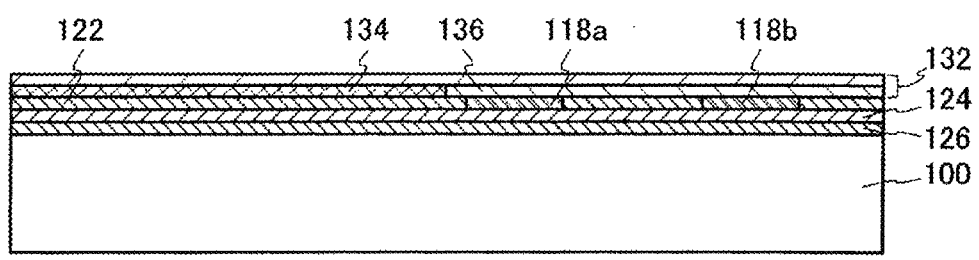

Next, an SOI substrate in which the single crystal semiconductor layer 132 is formed over the base substrate 100 is manufactured by the method illustrated in FIGS. 5A to 5G (or FIGS. 6A to 6G) and FIGS. 1A to 1F (see FIG. 8B). Accordingly, an SOI substrate in which the region 134 and the region 136 are in contact with the insulating layer 122, the wiring layer 118*a*, or the wiring layer 118*b* is formed.

Figure 8C:
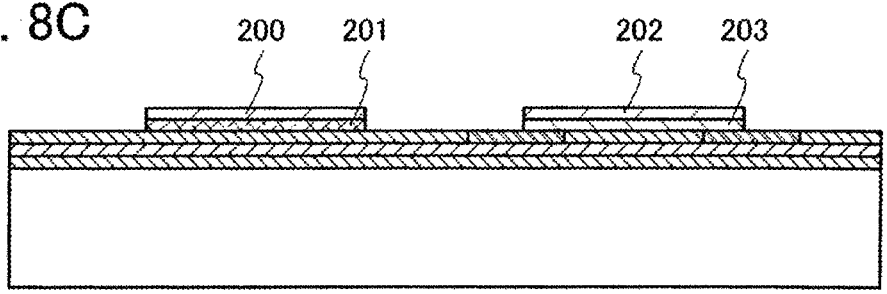
Figure 8D:
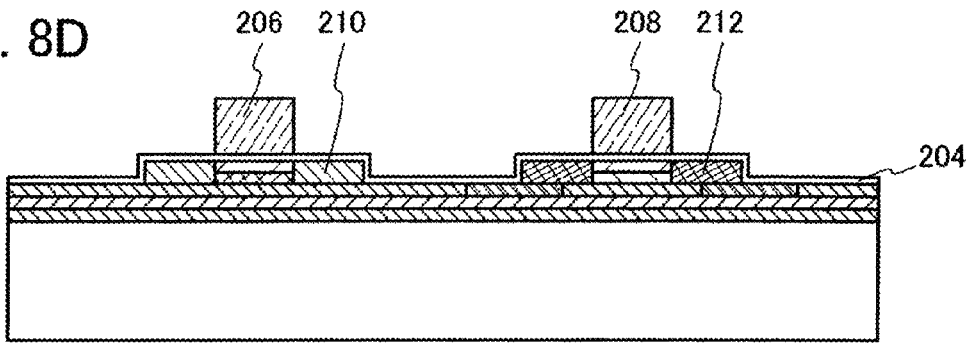
Figure 8E:
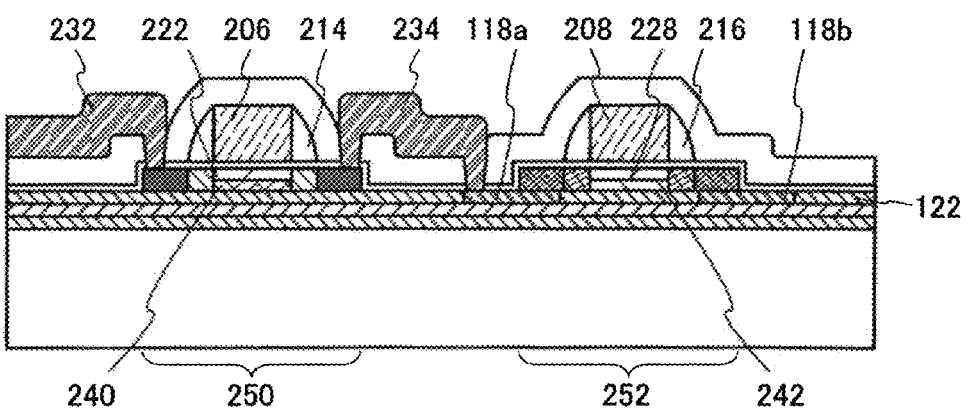

After that, transistors are formed by the method illustrated in FIGS. 2A to 2D, FIGS. 3A to 3D, and FIGS. 4A and 4B (see FIGS. 8C, 8D, and 8E). The thus-formed n-channel transistor 250 and the p-channel transistor 252 includes the channel region 222 and the channel region 228, respectively, in each of which the impurity element for controlling the threshold voltage is added at a low concentration on the gate insulating layer 204 side. On the insulating layer 122 side in the channel region 222 and the channel region 228, the region 240 and the region 242 into each of which the impurity element is added at a relatively high concentration are included.

In the foregoing manner, a semiconductor device of this embodiment mode can be manufactured. In this embodiment mode, in each of the transistors, an impurity element imparting opposite polarity to that of carriers of the transistor is added into the gate insulating layer side in a channel region at a low concentration; thus, the threshold voltage of the transistor is controlled. In addition, the impurity element imparting opposite polarity to that of carriers of the transistor is added into the insulating layer 122 side in the channel region at a relatively high concentration. Accordingly, channels are easily formed on the gate insulating layer 204 side and channels are difficult to be formed on the insulating layer 122 side, which can suppress generation of back channel and can reduce OFF current (also referred to as a leakage current). In particular, as the miniaturization of transistors advances, the problem of OFF current due to a so-called short channel effect becomes more serious. However, by employing such a structure as in this embodiment mode, OFF current can be reduced even when miniaturization is performed; accordingly, a semiconductor device with excellent characteristics can be provided.

Note that this embodiment mode can be implemented in combination with any of the above embodiment modes as appropriate.

(Embodiment Mode 5)

In Embodiment Mode 5, electronic devices using a semiconductor device, particularly a display device of the present invention will be described with reference to FIGS. 9A to 9H and FIG. 10A to 10C.

The following can be given as electronic devices manufactured using a semiconductor device (particularly, a display device) of the present invention: cameras such as a video camera or a digital camera, goggle type displays (head mounted displays), navigation systems, audio reproducing devices (car audio component set, or the like), computers, game machines, portable information terminals (mobile computers, mobile phones, portable game machines, e-book readers, or the like), image reproducing devices provided with a recording medium (specifically, devices provided with a display that can reproduce a content of a recording medium such as a digital versatile disc (DVD) and display the image), and the like.

Figure 9A:
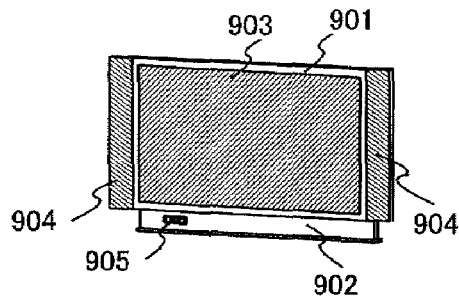
FIGS. 9A to 9H illustrate electronic devices using a semiconductor device.

FIG. 9A illustrates a television set or a monitor of a personal computer, which includes a housing 901, a supporting base 902, a display portion 903, speaker portions 904, a video input terminal 905, and the like. A semiconductor device of the present invention is used for the display portion 903. Since a semiconductor device with increased freedom of wirings and increased integration degree can be manufactured with the use of the present invention, a television set or a monitor of a personal computer having high performance can be provided.

Figure 9B:
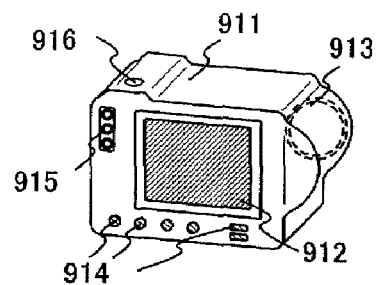

FIG. 9B illustrates a digital camera. An image receiving portion 913 is provided in the front side of a main body 911. A shutter button 916 is provided at the upper portion of the main body 911. A display portion 912, operation keys 914, and an external connection port 915 are provided at the backside of the main body 911. A semiconductor device of the present invention is used for the display portion 912. With the use of the present invention, a high-performance digital camera can be provided.

Figure 9C:
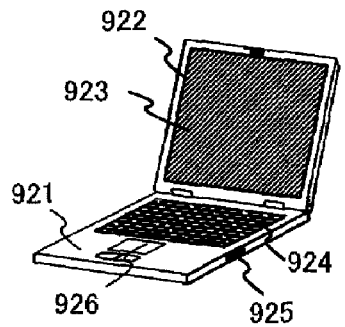

FIG. 9C illustrates a notebook personal computer. A main body 921 is provided with a keyboard 924, an external connection port 925, and a pointing device 926. Moreover, a housing 922 having a display portion 923 is attached to the main body 921. The semiconductor device of the present invention is used for the display portion 923. With the use of the present invention, a high-performance laptop personal computer can be provided.

Figure 9D:
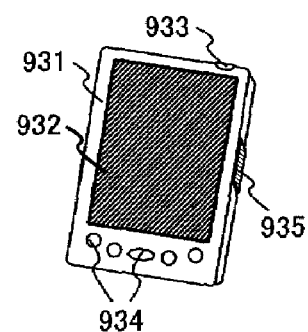

FIG. 9D illustrates a mobile computer which includes a main body 931, a display portion 932, a switch 933, operation keys 934, an infrared port 935, and the like. An active matrix display device is provided in the display portion 932. The semiconductor device of the present invention is used for the display portion 932. With the use of the present invention, a high-performance mobile computer can be provided.

Figure 9E:
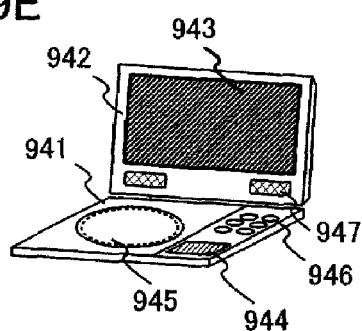

FIG. 9E illustrates an image reproducing device. In a main body 941, a display portion 944, a storage media reader 945, and operation keys 946 are provided. A housing 942 including a speaker portion 947 and a display portion 943 is attached to the main body 941. The semiconductor device of the present invention is used for each of the display portion 943 and the display portion 944. With the use of the present invention, a high-performance image reproducing device can be provided.

Figure 9F:
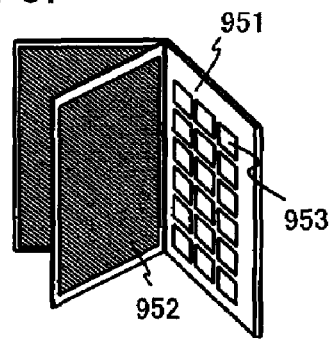

FIG. 9F illustrates an e-book reader. Operation keys 953 are provided in a main body 951. A plurality of display portions 952 are attached to the main body 951. The semiconductor device of the present invention is used for the display portions 952. With the use of the present invention, a high-performance e-book reader can be provided.

Figure 9G:
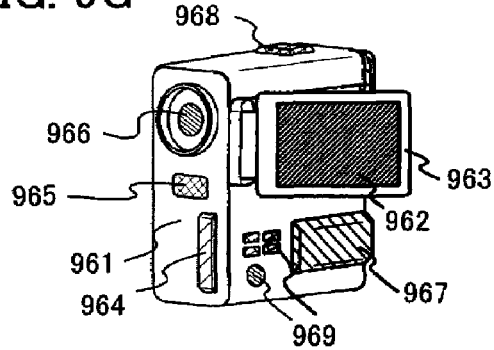

FIG. 9G illustrates a video camera. A main body 961 is provided with an external connection port 964, a remote control receiving portion 965, an image receiving portion 966, a battery 967, an audio input portion 968, and operation keys 969. A housing 963 including a display portion 962 is attached to the main body 961. The semiconductor device of the present invention is used for the display portion 962. With the use of the present invention, a high-performance video camera can be provided.

Figure 9H:
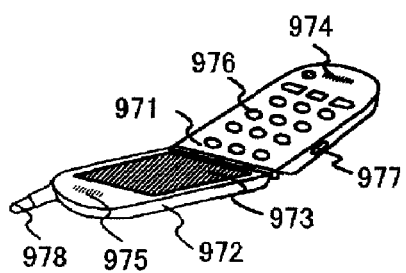

FIG. 9H illustrates a mobile phone, which includes a main body 971, a housing 972, a display portion 973, an audio input portion 974, an audio output portion 975, operation keys 976, an external connecting port 977, an antenna 978, and the like. The semiconductor device of the present invention is used for the display portion 973. With the use of the present invention, a high-performance mobile phone can be provided.

Figure 10A:
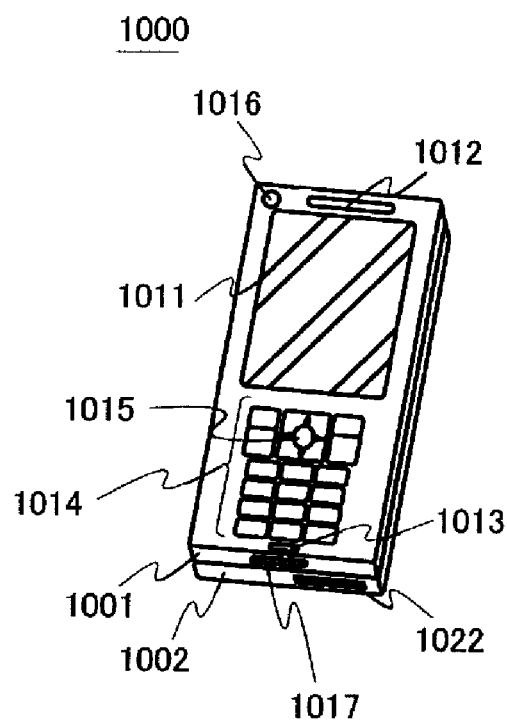
FIGS. 10A to 10C illustrate an electronic device using a semiconductor device.
Figure 10B:
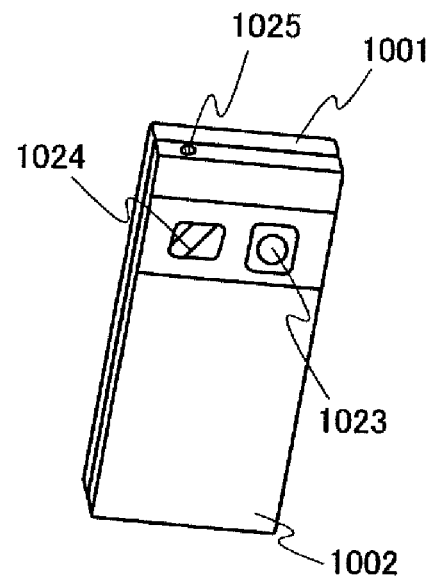
Figure 10C:
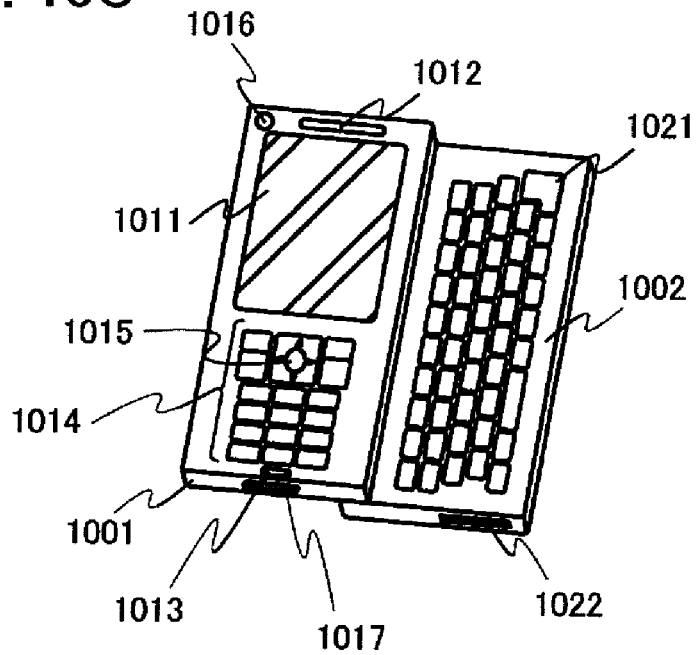

FIGS. 10A to 10C illustrate a structural example of a portable electronic device 1000 having functions as a telephone and an information terminal. FIG. 10A is a front view, FIG. 10B is a rear view, and FIG. 10C is a development view. The portable electronic device 1000 has functions as both a telephone and an information terminal and is an electronic device so-called a smartphone which is capable of various data processing in addition to voice call.

The portable electronic device 1000 includes a housing 1001 and a housing 1002. The housing 1001 is provided with a display portion 1011, a speaker 1012, a microphone 1013, operation keys 1014, a pointing device 1015, a lens 1016 for camera, an external connection terminal 1017, and the like. The housing 1002 is provided with a keyboard 1021, an external memory slot 1022, a lens 1023 for camera, a light 1024, an earphone terminal 1025, and the like. In addition, an antenna is incorporated in the housing 1001. In addition to the above-described structure, a wireless IC chip, a small size memory device, or the like may be incorporated therein.

The semiconductor device of the present invention is incorporated in the display portion 1011. An image displayed in the display portion 1011 (and the direction in which the image is displayed) variously changes depending on the usage pattern of the portable electronic device 1000. Moreover, since the display portion 1011 and the lens 1016 for camera are provided in the same plane, voice call with images (so-called videophone) is possible. Note that the speaker 1012 and the microphone 1013 can be used not only for voice call but also for recording, reproducing, or the like. In the case where a still image and a moving image are shot by using the lens 1023 for camera (and the light 1024), the display portion 1011 is used as a finder. The operation keys 1014 are used for incoming/outgoing of phone call, inputting simple information such as e-mail, screen scrolling, moving a cursor, and the like.

The housings 1001 and 1002 overlapped with each other slide and can be developed as illustrated in FIG. 10C, so that the portable electronic device 1000 can be used as an information terminal. In this case, smooth operation with the keyboard 1021 and the pointing device 1015 can be performed. The external connection terminal 1017 can be connected to various cables such as an AC adopter or a USB cable, whereby the portable electronic device 1000 can be charged or can perform data communication with a computer or the like. Moreover, by inserting a recording medium into the external memory slot 1022, the portable electronic device 1000 can deal with storing and moving a large capacity of data. In addition to the above-described functions, a wireless communication function using electromagnetic waves such as infrared rays, a television receiving function, and the like can be included. With the use of the present invention, a high-performance portable electronic device can be provided.

The applicable range of the present invention is extremely wide as described above and can be used for electronic devices in various fields. Note that this embodiment mode can be implemented in combination with any of the above embodiment modes as appropriate.

(Embodiment Mode 6)

In Embodiment Mode 6, a structure of a transistor manufactured in consideration of the voltage resistance will be described with reference to FIGS. 11A to 11D and FIGS. 12A and 12B. First, an SOI substrate is manufactured by the method illustrated in FIGS. 1A to 1F, FIGS. 5A to 5G, FIGS. 6A to 6G, or the like (see FIG. 11A). The SOI substrate has a structure in which the insulating layer 126, the insulating layer 124, the insulating layer 122, the wiring layer 118, and the single crystal semiconductor layer 132 are sequentially stacked over the base substrate 100. The wiring layer 118 is partially provided in this embodiment mode; however, the present invention is not limited to this, and the wiring layer 118 may also be provided over an entire surface of the insulating layer 124. In the transistor described in this embodiment mode, the wiring layer 118 serves as a drain wiring (or a source wiring).

Next, an impurity element imparting one conductivity type is added into the single crystal semiconductor layer 132 to form a semiconductor layer 260 which later serves as a drain region (or a source region). In this embodiment mode, an impurity element imparting n-type conductivity (e.g., phosphorus, arsenic, or the like) is added at a high concentration. Then, by utilizing epitaxial growth in which the semiconductor layer 260 is used as a seed layer, a semiconductor layer 262 is formed over the semiconductor layer 260. The semiconductor layer 262 can be formed by, for example, vapor-phase growth using a CVD method. Alternatively, the semiconductor layer 262 may be formed by solid-phase growth for crystallization in the following manner: after formation of an amorphous semiconductor layer over the single crystal semiconductor layer 132, heat treatment (e.g., heat treatment at 500° C. to 800° C. for 3 seconds to 180 seconds by a rapid thermal anneal (RTA) method) is performed (see FIG. 11B).

The semiconductor layer 262 can be formed using a material similar to that of the semiconductor layer 260, and for example, the semiconductor layer 262 formed of single crystal silicon can be formed over the semiconductor layer 260 formed of single crystal silicon by epitaxial growth. The crystallinity of the semiconductor layer 262 can be varied depending on the manufacturing conditions. Therefore, the crystallinity of the semiconductor layer 262 is not particularly limited. Further, the thickness of the semiconductor layer 262 can be made to be equal to or greater than 1 μm for example, but the thickness can be changed as appropriate in accordance with the required voltage resistance. In addition, the semiconductor layer 262 is formed to contain an n-type impurity element at a low concentration.

In this embodiment mode, the impurity element imparting n-type conductivity is added after manufacturing the SOI substrate; however, the present invention is not limited to this. For example, the step of adding the impurity element can be eliminated by manufacturing an SOI substrate using an n-type single crystal semiconductor substrate. In addition, although the semiconductor layer 262 is formed over the semiconductor layer 260 by epitaxial growth in this embodiment mode, formation of the semiconductor layer 262 may be eliminated by forming the single crystal semiconductor layer 132 thickly. In such a case, the impurity element imparting n-type conductivity may be added so as to be contained in a lower part of the single crystal semiconductor layer 132 at a high concentration and in an upper part of the single crystal semiconductor layer 132 at a low concentration.

Figure 11A:
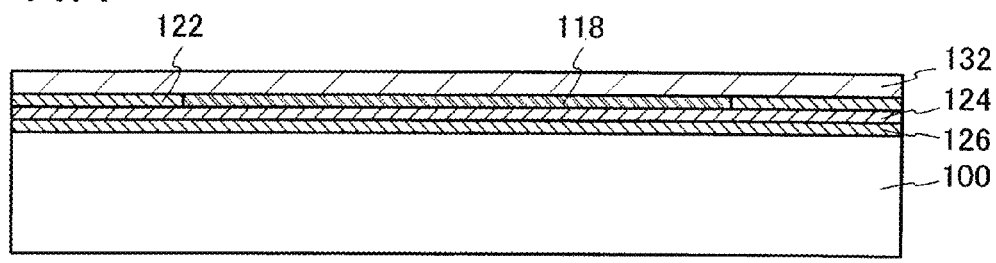
FIGS. 11A to 11D illustrate a manufacturing method of a semiconductor device.
Figure 11B:
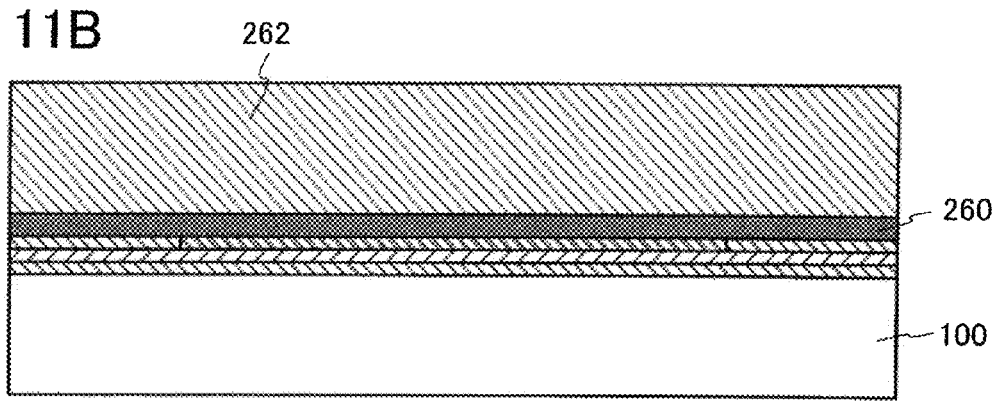
Figure 11C:
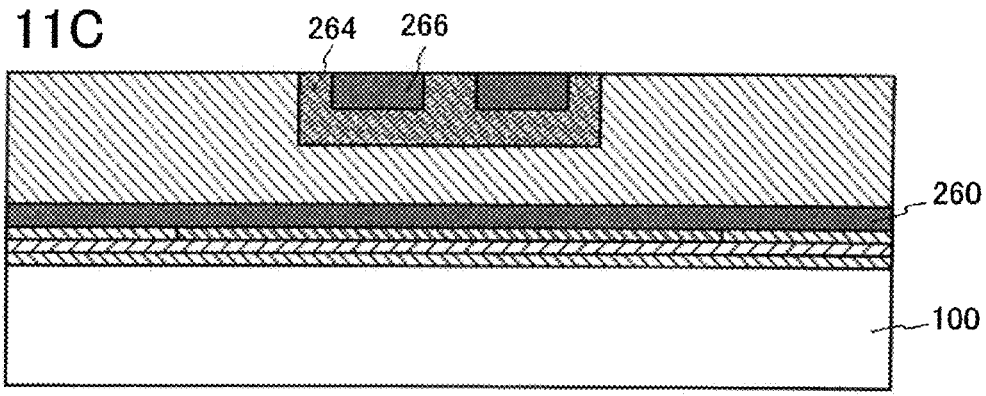
Figure 11D:
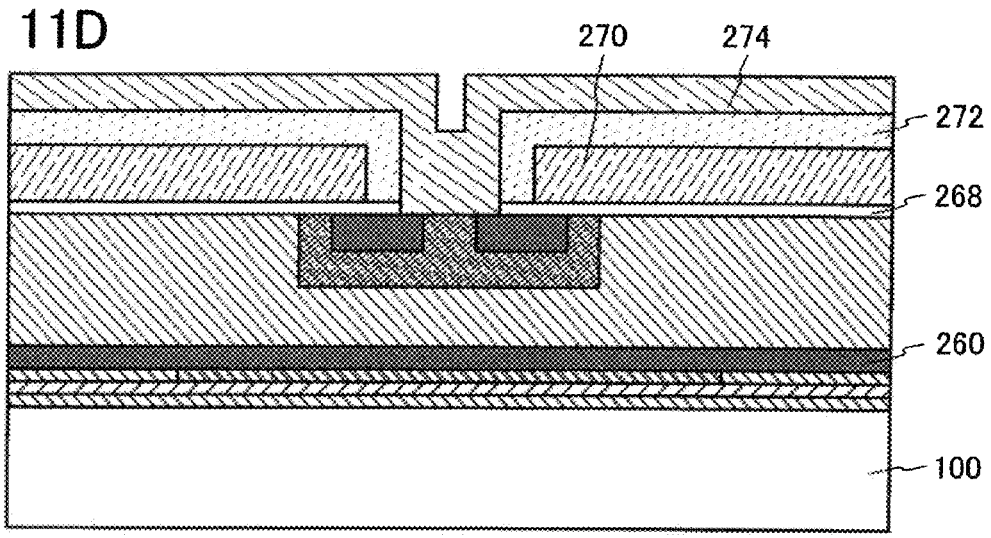

Then, an impurity element imparting p-type conductivity (e.g., boron or the like) and an impurity element imparting n-type conductivity are selectively added into the semiconductor layer 262 to form a p-type region 264 and an n-type region 266 (see FIG. 11C). Here, part of the p-type region 264 is a region which serves as a channel region later and the n-type region 266 is a region which serves as a source region (or a drain region) later.

After formation of the p-type region 264 and the n-type region 266, a gate insulating layer 268 is formed over the semiconductor layer 262, and a gate electrode 270 is selectively formed over the gate insulating layer 268. Here, it is preferable that at least part of the gate electrode 270 overlaps with the n-type region 266. Thus, the concentration of electric field is alleviated, whereby higher voltage resistance can be obtained. Then, after an insulating layer 272 is formed to cover the gate electrode 270, an opening is formed in the insulating layer 272 and the gate insulating layer 268, and a wiring layer 274 which is electrically connected to the n-type region 266 is formed (see FIG. 11D). Note that the wiring layer 274 serves as a source wiring (or a drain wiring).

Figure 12A:
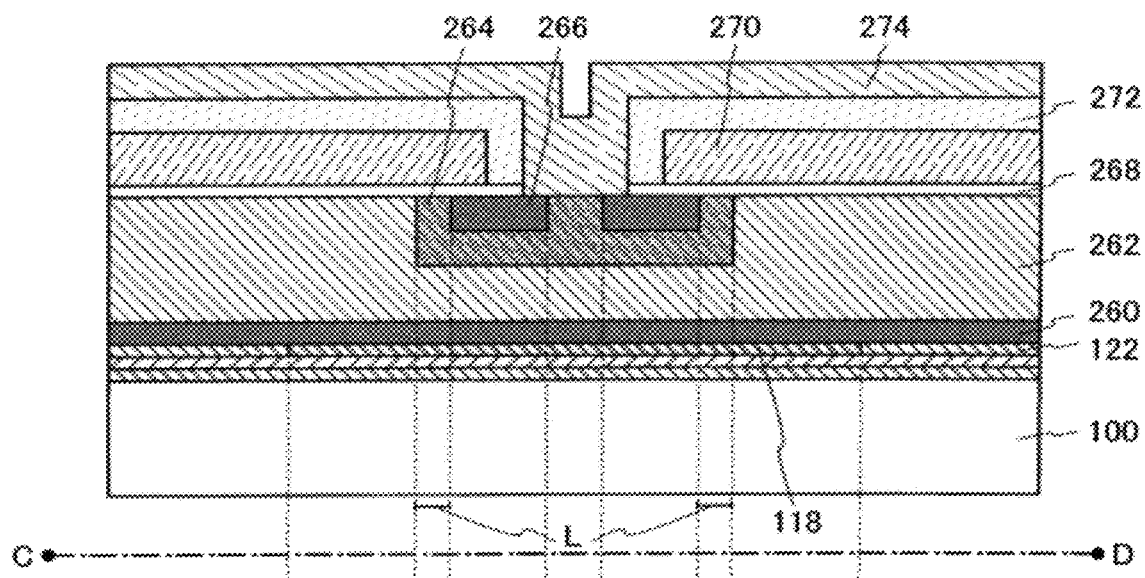
FIGS. 12A and 12B are a cross-sectional view and a plan view, respectively, of a semiconductor device.
Figure 12B:
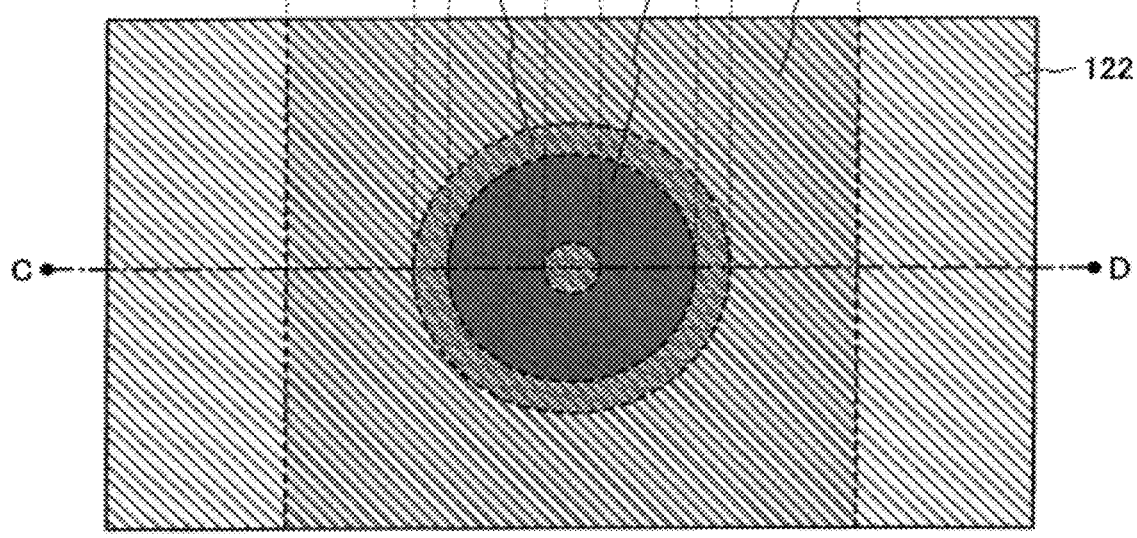

In the foregoing manner, a transistor with high voltage resistance can be obtained. In FIGS. 12A and 12B, the relationship between a plan view and a cross-sectional view of the transistor of this embodiment mode is illustrated. FIG. 12A is the cross-sectional view of the transistor of this embodiment mode, and FIG. 12B is the plan view thereof. Here, FIG. 12A corresponds to a cross section taken along a line C-D in FIG. 12B. In FIG. 12B, part of components such as the semiconductor layer 262, the gate insulating layer 268, the gate electrode 270, the insulating layer 272, and the wiring layer 274 are omitted for simplicity. For example, a structure in which the wiring layer 118 provided below the transistor is electrically connected to a wiring layer provided above the transistor can be employed.

In this embodiment mode, the p-type region 264 and the n-type region 266 are circular (see FIG. 12B); however, the present invention is not limited to this. The p-type region 264 and the n-type region 266 may have a rectangular shape or other shapes. Note that in the case where the p-type region 264 and the n-type region 266 are circular as described in this embodiment mode, the channel length L can be uniform. Accordingly, the concentration of electric field in the channel region can be alleviated, whereby the transistor can have higher voltage resistance. Note that since the wiring layer 118 in contact with the semiconductor layer 260 is included in this embodiment mode, an effect of improving the waste heat efficiency of the transistor through which high current flows can be obtained.

This embodiment mode can be implemented in combination with any of the above embodiment modes as appropriate.

This application is based on Japanese Patent Application serial No. 2007-312762 filed with Japan Patent Office on Dec. 3, 2007, the entire contents of which are hereby incorporated by reference.

What is claimed is:

1. A manufacturing method of a semiconductor device, comprising:
    forming a damaged region in a single crystal semiconductor substrate by irradiating the single crystal semiconductor substrate with ions;
    forming a first wiring layer on a surface of the single crystal semiconductor substrate;
    forming a first insulating layer on the surface of the single crystal semiconductor substrate;
    forming a second insulating layer over the first wiring layer and the first insulating layer;
    bonding the second insulating layer and an insulating substrate to each other;
    separating a single crystal semiconductor layer from the single crystal semiconductor substrate at the damaged region to form a stack of the first wiring layer and the single crystal semiconductor layer over the insulating substrate;
    exposing a part of the first wiring layer by patterning the single crystal semiconductor layer;
    forming a gate electrode over the patterned single crystal semiconductor layer with a gate insulating layer interposed therebetween;
    forming a third insulating layer over the gate electrode;
    forming an opening in the third insulating layer so as to expose a part of the first wiring layer; and
    forming a second wiring layer electrically connected to the first wiring layer through the opening, over the third insulating layer.

2. The manufacturing method according to claim 1, wherein the first wiring layer is selectively formed on the surface of the single crystal semiconductor substrate and the first insulating layer is formed in a region other than a region in which the first wiring layer is formed, on the surface of the single crystal semiconductor substrate.

3. The manufacturing method according to claim 1, wherein the patterned single crystal semiconductor layer includes an impurity region, a part of the first wiring layer is in contact with the impurity region, and the second wiring layer and the impurity region are electrically connected to each other.

4. The manufacturing method according to claim 1, wherein the method further comprises irradiating the single crystal semiconductor layer with a laser beam before the step of patterning.

5. The manufacturing method according to claim 1, wherein the method further comprises selectively adding an impurity element to the single crystal semiconductor substrate before the step of forming the first wiring layer and the second insulating layer.

6. The manufacturing method according to claim 1,
    wherein the first wiring layer is formed after the forming step of the damaged region, and
    wherein the first insulating layer is formed after the forming step of the first wiring layer.

7. A manufacturing method of a semiconductor device, comprising:
    forming a damaged region in a single crystal semiconductor substrate by irradiation of the single crystal semiconductor substrate with ions;
    forming a first wiring layer on a surface of the single crystal semiconductor substrate;
    forming a first electrode on the surface of the single crystal semiconductor substrate;
    forming a first insulating layer on the surface of the single crystal semiconductor substrate;
    forming a second insulating layer over the first wiring layer, the first electrode, and the first insulating layer;
    bonding the second insulating layer and an insulating substrate to each other;
    separating a single crystal semiconductor layer from the single crystal semiconductor substrate at the damaged region to form a stack of the first wiring layer and the single crystal semiconductor layer over the insulating substrate;
    exposing the first electrode and a part of the first wiring layer by patterning the single crystal semiconductor layer;
    forming a gate electrode over the patterned single crystal semiconductor layer with a gate insulating layer interposed therebetween;
    forming a second electrode over the first electrode with the gate insulating layer interposed therebetween;
    forming a third insulating layer over the gate electrode;
    forming an opening in the third insulating layer to expose part of the first wiring layer; and
    forming a second wiring layer electrically connected to the first wiring layer through the opening over the third insulating layer.

8. The manufacturing method according to claim 7, wherein the first wiring layer is selectively formed on the surface of the single crystal semiconductor substrate and the first insulating layer is formed in a region other than a region in which the first wiring layer is formed, on the surface of the single crystal semiconductor substrate.

9. The manufacturing method according to claim 7, wherein the patterned single crystal semiconductor layer includes an impurity region, a part of the first wiring layer is in contact with the impurity region, and the second wiring layer and the impurity region are electrically connected to each other.

10. The manufacturing method according to claim 7, wherein the method further comprises irradiating the single crystal semiconductor layer with a laser beam before the step of patterning.

11. The manufacturing method according to claim 7, wherein the method further comprises selectively adding an impurity element to the single crystal semiconductor substrate before the step of forming the first wiring layer, the first electrode, and the second insulating layer.

12. The manufacturing method according to claim 7,
wherein the first wiring layer is formed after the forming step of the damaged region,
wherein the first electrode is formed after the forming step of the first wiring layer,
wherein the first insulating layer is formed after the forming step of the first electrode, and
wherein the second insulating layer is formed after the forming step of the first insulating layer.

* * * * *